(12) United States Patent
Katagiri et al.

(10) Patent No.: US 9,820,380 B2
(45) Date of Patent: Nov. 14, 2017

(54) TRANSPARENT CONDUCTIVE FILM AND METHOD FOR PRODUCING TRANSPARENT CONDUCTIVE FILM

(71) Applicant: FUJIFILM Corporation, Tokyo (JP)

(72) Inventors: Kensuke Katagiri, Kanagawa-ken (JP); Shin Tajiri, Kanagawa-ken (JP); Akihiko Hase, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/444,203

(22) Filed: Feb. 27, 2017

(65) Prior Publication Data

US 2017/0171972 A1   Jun. 15, 2017

Related U.S. Application Data

(60) Division of application No. 14/947,831, filed on Nov. 20, 2015, which is a continuation of application No. PCT/JP2014/062783, filed on May 14, 2014.

(30) Foreign Application Priority Data

May 24, 2013  (JP) .................................. 2013-110402
Mar. 7, 2014  (JP) .................................. 2014-045684

(51) Int. Cl.
*H05K 1/00*   (2006.01)
*H05K 1/09*   (2006.01)
(Continued)

(52) U.S. Cl.
CPC .............. *H05K 1/09* (2013.01); *G06F 3/041* (2013.01); *H05K 3/027* (2013.01); *H05K 2201/0364* (2013.01); *H05K 2203/0502* (2013.01)

(58) Field of Classification Search
CPC .. H05K 1/09; H05K 3/027; H05K 2201/0364; H05K 2203/0502;
(Continued)

(56) References Cited

U.S. PATENT DOCUMENTS 8,133,377 B2   3/2012 Okazaki et al.
8,852,694 B2 * 10/2014 Crosby .................. B05D 5/02
                                                 427/508

(Continued)

FOREIGN PATENT DOCUMENTS

JP    08-115645 A    5/1996
JP    2000-351170 A  12/2000
(Continued)

OTHER PUBLICATIONS

International Search Report—PCT/JP2014/062783 dated Jul. 1, 2014.
(Continued)

*Primary Examiner* — Steven T Sawyer
(74) *Attorney, Agent, or Firm* — Studebaker & Brackett PC

(57) ABSTRACT

A transparent conductive film comprises a transparent substrate and a metal wiring portion formed thereon. A thin metal wire contained in an electrode portion in the metal wiring portion has a surface shape satisfying the condition of $Ra^2/Sm > 0.01$ μm and has a metal volume content of 35% or more. Ra represents an arithmetic average roughness in micrometers and is equal to or smaller than the thickness of a metal wiring located in a position where the surface roughness is measured. Sm represents an average distance between convex portions and is 0.01 μm or more.

4 Claims, 11 Drawing Sheets

(51) Int. Cl.
*H05K 3/02* (2006.01)
*G06F 3/041* (2006.01)

(58) Field of Classification Search
CPC .......... G06F 3/041; G03F 7/027; G03F 7/203; Y10T 428/24355
USPC .................................. 428/141; 430/296, 325
See application file for complete search history.

(56) References Cited

U.S. PATENT DOCUMENTS

| | | | |
|---|---|---|---|
| 2002/0004216 A1* | 1/2002 | Abbott | G01N 21/75 |
| | | | 435/7.92 |
| 2009/0002832 A1* | 1/2009 | Tochigi | G02B 5/0226 |
| | | | 359/599 |
| 2009/0284475 A1 | 11/2009 | Nashiki et al. | |
| 2009/0295285 A1 | 12/2009 | Tokunaga et al. | |
| 2011/0285019 A1 | 11/2011 | Alden et al. | |
| 2013/0045362 A1* | 2/2013 | Chang | G03F 7/027 |
| | | | 428/141 |
| 2015/0234271 A1 | 8/2015 | Tokunaga et al. | |

FOREIGN PATENT DOCUMENTS

| | | |
|---|---|---|
| JP | 3305459 B2 | 7/2002 |
| JP | 2003-213437 A | 7/2003 |
| JP | 2004-004404 A | 1/2004 |
| JP | 2004-085655 A | 3/2004 |
| JP | 2004-184693 A | 7/2004 |
| JP | 2004-244080 A | 9/2004 |
| JP | 2004-334077 A | 11/2004 |
| JP | 2005-010752 A | 1/2005 |
| JP | 2005-070435 A | 3/2005 |
| JP | 2005-235491 A | 9/2005 |
| JP | 2006-058797 A | 3/2006 |
| JP | 2006-064923 A | 3/2006 |
| JP | 3754745 B2 | 3/2006 |
| JP | 2006-135271 A | 5/2006 |
| JP | 2007-103348 A | 4/2007 |
| JP | 2009-004726 A | 1/2009 |
| JP | 2009-505358 A | 2/2009 |
| JP | 2010-165642 A | 7/2010 |
| JP | 2010-198918 A | 9/2010 |
| JP | 2010-199016 A | 9/2010 |
| JP | 2010-277927 A | 12/2010 |
| JP | 2011-082211 A | 4/2011 |
| JP | 2011-175601 A | 9/2011 |
| JP | 2011-192401 A | 9/2011 |
| JP | 2012-059191 A | 3/2012 |
| JP | 2012-174600 A | 9/2012 |
| JP | 2013-098166 A | 5/2013 |
| KR | 10-2013-0048134 A | 5/2013 |
| WO | 2014/073677 A1 | 5/2014 |

OTHER PUBLICATIONS

Kang et al, "Sintering of Inkjet-Printed Silver Nanoparticles at Room Temperature Using Intense Pulsed Light", Journal of Electronic Materials, 2011, 40, pp. 2268-2277.

An Office Action; "Rejection of the Application" issued by the Korean Patent Office dated Apr. 20, 2016, which corresponds to Korean Patent Application No. 10-2015-7033290 and is related to U.S. Appl. No. 14/947,831; with English language partial translation.

The First Office Action issued by the State Intellectual Property Office of People's Republic of China dated May 31, 2016, which corresponds to Chinese Patent Application No. 201480030001.9 and is related to U.S. Appl. No. 14/947,831; with English language translation.

An Office Action; "Notification of Reasons for Refusal," issued by the Japanese Patent Office dated Sep. 20, 2016, which corresponds to Japanese Patent Application No. 2014-045684 and is related to U.S. Appl. No. 14/947,831; with English language translation.

An Office Action; "Decision of Refusal," issued by the Japanese Patent Office dated Dec. 13, 2016, which corresponds to Japanese Patent Application No. 2014-045684 and is related to U.S. Appl. No. 14/947,831; with English language translation.

* cited by examiner

TRANSPARENT CONDUCTIVE FILM AND METHOD FOR PRODUCING TRANSPARENT CONDUCTIVE FILM

CROSS-REFERENCE TO RELATED APPLICATIONS AND PRIORITY CLAIMS

This application is a Divisional of U.S. application Ser. No. 14/947,831 filed on Nov. 20, 2015, which is a Continuation of International Application No. PCT/JP2014/062783 filed on May 14, 2014, which was published under PCT Article 21(2) in Japanese, which is based upon and claims the benefit of priorities from Japanese Patent Application No. 2013-110402 filed on May 24, 2013 and Japanese Patent Application No. 2014-045684 filed on Mar. 7, 2014, the contents all of which are incorporated herein by reference.

TECHNICAL FIELD

The present invention relates to a transparent conductive film and a method for producing a transparent conductive film.

BACKGROUND ART

Metals have high conductivity and therefore are suitable for use in a material for a conductive layer. But at the same time, the metals intensely reflect visible lights, and are unsuitable for use in applications such as touch panel applications, in which a visible electrode pattern is considered as a critical defect. Therefore, a transparent conductive oxide such as ITO (Indium Tin Oxide) has been used conventionally in such applications.

Meanwhile, a metal, which has advantages including patterning easiness, excellent flexibility, and low resistance over the oxide, has been studied as an alternative to the ITO. In recent years, it has been found that the problem of the visible metal wiring can be reduced to some extent by thinning the metal wire or by modifying the pattern.

Conventional technologies for thinning the metal wire include a technology containing using a metal nanowire in a transparent conductive film as described in Japanese Laid-Open Patent Publication No. 2009-505358 (PCT) etc. and a technology containing, utilizing a photographic material technology, exposing and developing a photosensitive material having a silver salt emulsion layer to produce a transparent conductive film. However, in the technologies, the electrical resistance of the resultant wiring is higher than the inherent resistance of the metal disadvantageously, e.g. because a large number of contact points are formed between fine metal particles.

To solve this problem, technology development has been actively studied on a calender treatment (Japanese Laid-Open Patent Publication No. 2009-004726), a photo-fusion treatment (Journal of Electronic Materials, 2011, 40, 2268-2277, J. S. Kang, J. Ryu, H. S. Kim, H. T. Hahn, Sintering of Inkjet-Printed Silver Nanoparticles at Room Temperature Using Intense Pulsed Light), and the like. However, these treatments are disadvantageous in that metallic reflection is enhanced to make a conductive film pattern further visible.

For example, as a technology for making the conductive film pattern less visible, Japanese Laid-Open Patent Publication No. 2011-082211 discloses a method for preventing the reflection from the conductive pattern, which contains stacking a blackening layer having a thickness of 0.01 to 0.5 μm on a surface of a conductive pattern layer. However, in the technology of Japanese Laid-Open Patent Publication No. 2011-082211, conductivity reduction cannot be avoided in principle disadvantageously. Incidentally, a technology for giving an antiglare function to an antireflection film has been known (see Japanese Laid-Open Patent Publication Nos. 2005-070435 and 2004-004404).

SUMMARY OF INVENTION

As described above, due to the inherent reflection of the metal, the thin metal wire is visually detected easily in the transparent conductive film or the like, and the thin metal wire pattern is highly visible. Though the thin metal wire can be made less visible by thinning the wire or by modifying the pattern, this method tends to result in an increased electrical resistance. Though the resistance can be reduced by increasing the volume content of the metal in a calender treatment or the like, this treatment results in a significantly increased light reflection. Thus, it is difficult to achieve both an appropriate visibility (low visibility of the wiring pattern) and a low resistance.

In view of the above problems, an object of the present invention is to provide a transparent conductive film, which can achieve both of an appropriate visibility and a low resistance due to a specific surface shape of a thin metal wire, and thereby can be suitably used in a touch panel, a display device, or the like.

Another object of the present invention is to provide a method for producing a transparent conductive film, which uses a calender with a pressing surface having appropriate material and surface, and thereby can achieve both an improved visibility and a low electrical resistance in the transparent conductive film.

A further object of the present invention is to provide a touch panel, which has a wiring pattern less visible on a display screen, and has a low electrical resistance and an excellent wiring adhesion, thereby resulting in high reliability.

A still further object of the present invention is to provide a display device, which contains a transparent conductive film on a display screen, has a less visible wiring pattern in the transparent conductive film, and has a low electrical resistance and an excellent wiring adhesion, thereby resulting in high reliability.

The inventors started to make a study on the use of the method containing pressing a concave-convex surface against a sample surface to achieve an antiglare function (see Japanese Laid-Open Patent Publication No. 2005-070435, etc.), for a transparent conductive film obtained by exposing and developing a photosensitive material having a silver salt emulsion layer.

In experiments, various surfaces were pressed against samples. As a result, it was found that most of common calender rollers caused the following problem. That is, light reflection could not be reduced, or a thin metal wire was broken though the light reflection could be reduced. As a result of further research, the inventors have found that a specific pressing surface having particular material and shape can achieve both light reflection reduction and resistance reduction in a thin metal wire. The present invention has been accomplished based on this finding.

Accordingly, the present invention includes the following components.

[1] According to a first aspect of the present invention, there is provided a transparent conductive film comprising a support and a metal wiring portion formed thereon, wherein at least a part of the metal wiring portion has a surface shape satisfying the condition of $Ra^2/Sm>0.01$ μm and has a metal volume content of 35% or more. Ra represents an arithmetic average roughness [μm] and is equal to or smaller than the thickness of a thin metal wire located in a position where the surface roughness is measured. Sm represents an average distance [μm] between convex portions and is 0.01 μm or more. The definitions are applied also in the following description.

In general, a conventional metal wiring portion has a luster surface. Therefore, the surface intensely reflects a visible light, and the ratio of the specularly reflected light to all the reflected lights (specular reflectance) is increased. As a result, the thin metal wire in at least the part of the metal wiring portion is highly visible disadvantageously. In addition, in a case where the thin metal wire has a low metal volume content, though the incident light is introduced into spaces between metal particles to lower the specular reflectance, the metal particles exhibit a loose connection, thereby resulting in a high electrical resistance disadvantageously. The electrical resistance of the thin metal wire can be lowered by performing a calender treatment or the like to increase the metal volume content. However, the metal particles are densely arranged on the surface, whereby the specular reflectance is significantly increased and the thin metal wire is made highly visible disadvantageously. Thus, it is difficult to achieve both an appropriate visibility (the thin metal wire being less visible) and a low resistance.

In contrast, in the first aspect of the present invention, at least the part of the metal wiring portion has the surface shape satisfying the condition of $Ra^2/Sm>0.01$ μm. In this case, the ratio of the scattered lights is increased and the specular reflectance is lowered, whereby the thin metal wire is less visible. Thus, even when the metal volume content is increased to 35% or more, the light reflection from the metal wiring portion can be reduced. Consequently, both of the appropriate visibility (the thin metal wire being less visible) and the low resistance can be achieved.

In the present invention, the surface shape (the surface roughness) is measured by a measuring apparatus having a spatial resolution of higher than 0.03 μm in the height and horizontal directions. Specifically, a laser microscope having an objective lens having a magnification of 100 or more is used, and an area of 100 to 300 μm is subjected to the measurement. Stylus-type surface roughness meter cannot be used for the surface roughness measurement in the present invention because of low spatial resolution.

[2] In the first aspect, it is preferred that at least the part of the metal wiring portion has Sm of 4 μm or less. In this case, the specular reflectance can be reduced to 1.2% or less.

[3] In the first aspect, it is preferred that at least the part of the metal wiring portion has a difference of less than 3% between the specular reflectances of its front surface and its back surface. The support has a surface having the metal wiring portion and the opposite surface, and the back surface of the metal wiring portion is the surface that can be observed from the opposite surface side through the support. The specular reflectances are determined by subtracting the reflectance at the interface between air and the support.

This is effective, for example, in a case where metal wiring portions (first and second metal wiring portions) are formed on the front and back surfaces of one support respectively.

In the transparent conductive film, the front surface of the first metal wiring portion and the back surface of the second metal wiring portion, which is observed through the support, have a specular reflectance difference of less than 3%. Therefore, the thin metal wire in the first metal wiring portion is less visible, and the thin metal wire in the second metal wiring portion is also less visible. Consequently, even in a case where the metal wiring portion is formed on each of the front and back surfaces of one support, the transparent conductive film can have an improved visibility, and the first and second metal wiring portions can have a low resistance.

[4] According to a second aspect of the present invention, there is provided a method for producing a transparent conductive film comprising a step of forming a metal wiring portion on a support and a calender step of pressing a metal member having a concave-convex surface against at least a part of the metal wiring portion, wherein the surface of the metal member has a shape with $Ra^2/Sm$ of more than 0.015 μm.

In this method, a transparent conductive film, which contains at least the part of the metal wiring portion having a surface shape satisfying the condition of $Ra^2/Sm>0.01$ μm and a metal volume content of 35% or more, can be easily produced.

[5] According to a third aspect of the present invention, there is provided a method for producing a transparent conductive film comprising a step of forming a metal wiring portion on a support and a calender step of pressing a metal member having a concave-convex surface against at least a part of the metal wiring portion, wherein the surface of the metal member has such a shape that Sm is equal to or smaller than the line width of a thin metal wire in at least the part of the metal wiring portion, Ra is equal to or smaller than ⅙ of the thickness of the thin metal wire measured before the calender step, and $Ra^2/Sm$ is more than 0.015 μm.

In this method, a transparent conductive film, which contains at least the part of the metal wiring portion having Sm of 4 μm or less, a surface shape satisfying the condition of $Ra^2/Sm>0.01$ μm, and a metal volume content of 35% or more, can be easily produced.

[6] According to a fourth aspect of the present invention, there is provided a method for producing a transparent conductive film comprising a step of forming a metal wiring portion on a support and a calender step of conveying a resin film having a concave-convex surface together with the metal wiring portion to press the resin film against at least a part of the metal wiring portion, wherein the surface of the resin film has a shape with Ra of more than 0.15 μm.

In this method, a transparent conductive film, which contains at least the part of the metal wiring portion having a surface shape satisfying the condition of $Ra^2/Sm>0.01$ μm and a metal volume content of 35% or more, can be easily produced.

[7] In this case, it is preferred that the surface of the resin film has a shape with $Ra^2/Sm$ of more than 0.01 μm. In this method, a transparent conductive film, which contains at least the part of the metal wiring portion having Sm of 4 μm or less, a surface shape satisfying the condition of $Ra^2/Sm>0.01$ μm, and a metal volume content of 35% or more, can be easily produced.

[8] According to a fifth aspect of the present invention, there is provided a method for producing a transparent conductive film comprising a step of forming a metal wiring portion on a support having a concave-convex surface, wherein the surface of the support has a shape with Ra of more than 0.15 μm and has $Ra^2/Sm$ of more than 0.02 μm.

In this case, the metal wiring portion is formed on the surface of the support, whereby the concave-convex shape of the support surface is transferred to the surface of the metal wiring portion. Thus, also in the method containing forming the metal wiring portion on the concave-convex surface of the support, the properties that at least the part of the metal wiring portion has a surface shape satisfying the condition of $Ra^2/Sm > 0.01$ μm and has a metal volume content of 35% or more can be achieved. Consequently, this method is capable of producing the transparent conductive film with a more excellent visibility as compared with a method of forming a metal film on a smooth surface.

[9] In this case, the step of forming the metal wiring portion on the support may contain vapor-depositing a metal on the surface of the support. In this method, a transparent conductive film, which contains the metal wiring portion having a surface shape satisfying the condition of $Ra^2/Sm > 0.01$ μm and a metal volume content of 35% or more, can be produced.

[10] Alternatively, the step of forming the metal wiring portion on the support may contain plating the surface of the support with a metal. Also in this case, a transparent conductive film, which contains the metal wiring portion having a surface shape satisfying the condition of $Ra^2/Sm > 0.01$ μm and a metal volume content of 35% or more, can be produced.

[11] In the second to fifth aspects, at least the part of the metal wiring portion may have a mesh pattern containing a thin metal wire.

[12] According to a sixth aspect of the present invention, there is provided a transparent conductive film obtained by the production method according to any one of the second to fifth aspects.

[13] In the first and sixth aspects, at least the part of the metal wiring portion may have a mesh pattern containing a thin metal wire.

[14] In the first and sixth aspects, the transparent conductive film may be obtained by a production method containing an exposure step of exposing a photosensitive material having the support and a silver salt emulsion layer formed thereon and a development step of developing the exposed silver salt emulsion layer to form a conductive pattern containing a metallic silver portion on the support.

[15] According to a seventh aspect of the present invention, there is provided a touch panel having the transparent conductive film according to the first or sixth aspect.

In this case, in a case where the touch panel is attached to a display screen, the wiring pattern is less visible, and the transparent conductive film exhibits a low electrical resistance and an excellent wiring adhesion, thereby resulting in high reliability.

[16] According to an eighth aspect of the present invention, there is provided a display device having the transparent conductive film according to the first or sixth aspect.

In this case, the transparent conductive film is attached to the display screen of the display device, the wiring pattern is less visible, and the transparent conductive film exhibits a low electrical resistance and an excellent wiring adhesion, thereby resulting in the display device with high reliability.

As described above, in the transparent conductive film of the present invention, the thin metal wire has a specific surface shape, whereby both of the appropriate visibility and the low resistance can be achieved. Thus, the transparent conductive film is suitable for use in the touch panel or the display device.

In the transparent conductive film production method of the present invention, the pressing surface of the calender contains an appropriate material and has a specific surface shape, whereby both of the appropriate visibility and the low resistance can be achieved.

Furthermore, in a case where the touch panel of the present invention is attached to the display screen, the wiring pattern is less visible, and the transparent conductive film exhibits a low electrical resistance and an excellent wiring adhesion, thereby resulting in high reliability.

In addition, in the display device of the present invention having the display screen and the transparent conductive film attached thereto, the wiring pattern is less visible, and the transparent conductive film exhibits a low electrical resistance and an excellent wiring adhesion, thereby resulting in high reliability.

The above objects, features, and advantages of the present invention will become more apparent from the following description when taken in conjunction with the accompanying drawings.

DESCRIPTION OF EMBODIMENTS

Several embodiment examples of the transparent conductive film, the production method, the touch panel, and the display device of the present invention will be described below with reference to FIGS. 1A to 11. It should be noted that, in this description, a numeric range of "A to B" includes both the numeric values A and B as the lower limit and upper limit values.

Figure 1A:
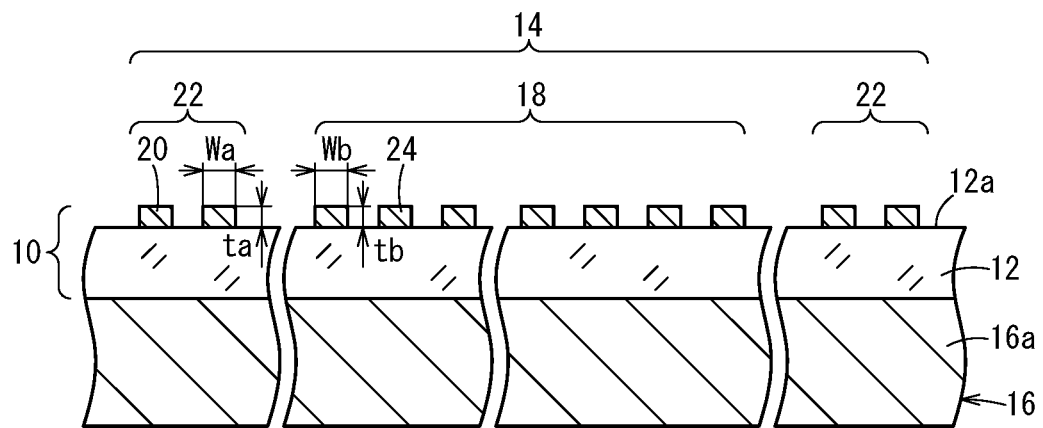
FIG. 1A is a partial cross-sectional view of a transparent conductive film according to an embodiment of the present invention, placed on a display panel of a display device.

As shown in FIG. 1A, a transparent conductive film 10 according to an embodiment of the present invention has a transparent substrate (support) 12 and a metal wiring portion 14 formed on a surface 12a of the transparent substrate 12. For example, the transparent conductive film 10 is attached to a display panel 16a of a display device 16. Thus, the transparent conductive film 10 may be used as an electromagnetic-shielding film of the display device 16, a transparent conductive film of a touch panel, or the like. Examples of such display devices 16 include liquid crystal displays, plasma displays, organic EL (electroluminescence) displays, and inorganic EL displays. The transparent conductive film 10 may be placed inside the display device 16 and integrally combined with the display device 16.

Figure 1B:
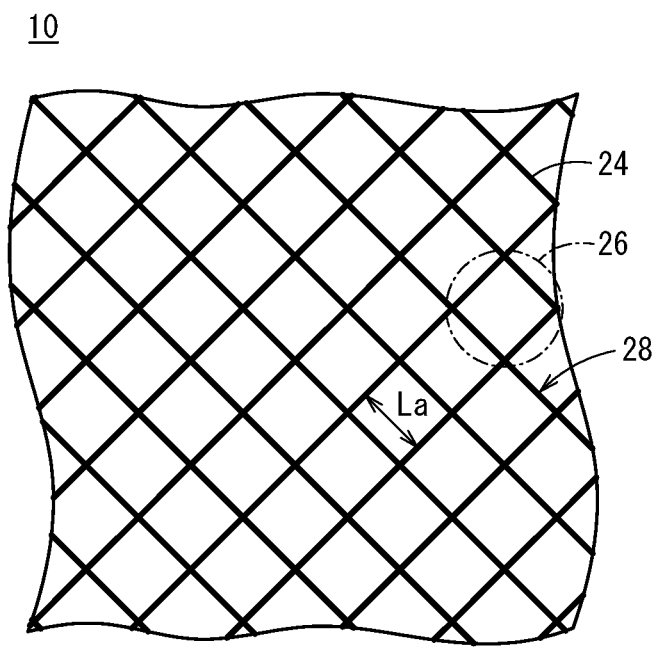
FIG. 1B is a partial plan view of the transparent conductive film.

The metal wiring portion 14 contains an electrode portion 18, which may be used in an electrode in the electromagnetic-shielding film, the touch panel, or the like, and further contains a wiring portion 22 having a large number of metal wirings 20, which may be used for supplying a drive signal to the electrode portion 18 or transmitting a signal from the electrode portion 18. As shown in FIG. 1B, for example, the electrode portion 18 has a mesh pattern 28, and a large number of lattices 26 containing a thin metal wire 24 are arranged in the mesh pattern 28. The metal wirings 20 and the thin metal wire 24 contain, for example, a metal mainly composed of gold (Au), silver (Ag), or copper (Cu).

The line width Wa of the metal wiring 20 and the line width Wb of the thin metal wire 24 satisfy the relationship of Wa≥Wb, and the thickness to of the metal wiring 20 and the thickness tb of the thin metal wire 24 satisfy the relationship of ta≥tb. In particular, the side length La of the lattice 26 containing the thin metal wire 24 in the electrode portion 18 is preferably 100 to 400 μm, more preferably 150 to 300 μm, most preferably 210 to 250 μm. In a case where the side length La of the lattice 26 is within the above range, the transparent conductive film 10 has a high transparency and thereby can be suitably used on the display panel 16a of the display device 16 with excellent and comfortable visibility. The lattice 26 may have a shape of square, rectangle, parallelogram, rhombus, or polygon such as hexagon or octagon.

The line width Wb of the thin metal wire 24 may be selected within a range of 30 μm or less. In the case of using the transparent conductive film 10 as the electromagnetic-shielding film, the line width Wb of the thin metal wire 24 is preferably 1 to 20 μm, more preferably 1 to 9 μm, further preferably 2 to 7 μm. In the case of using the transparent conductive film 10 in the touch panel, the line width Wb of the thin metal wire 24 is preferably 0.1 to 15 μm, more preferably 1 to 9 μm, further preferably 2 to 7 μm.

The transparent conductive film 10 of this embodiment may be used in a projected capacitive touch panel, a surface capacitive touch panel, or a resistive touch panel. The transparent conductive film 10 may be used also as an optical film on the display panel 16a of the display device 16.

In the transparent conductive film 10 of this embodiment, at least the electrode portion 18 in the metal wiring portion 14 has a surface shape satisfying the condition of $Ra^2/Sm > 0.01$ μm and has a metal volume content of 35% or more. In this condition, Ra represents an arithmetic average roughness [μm] and is equal to or smaller than the thickness of the thin metal wire located in a position where the surface roughness is measured. Sm represents an average distance [μm] between convex portions of 0.01 μm or more. The metal volume content is calculated using the amount M [g/m²] of the metal per unit area, the specific gravity d [g/m³] of the metal, and the average thickness H [m] measured in an SEM image of a cross section. Thus, the metal volume content is calculated by (the volume of the metal in the thin metal wire 24)/(the volume of the thin metal wire 24 with a binder and/or a void)=$M/(H \times d) \times 100$ [%]. The term "the thin metal wire 24" means a layer of the metal connected continuously, independent from undercoat layers and overcoat layers. The average thickness H is an average value measured by observing the cross section in a region of 1 mm or more in total. As the metal volume content is increased, the volume resistance is reduced advantageously. However, in a case where the metal volume content is excessively increased, the metallic reflection cannot be sufficiently prevented even when the surface shape is optimized. Therefore, the metal volume content is preferably 35% or more, more preferably 50% or more, further preferably 50% to 80%, particularly preferably 55% to 65%. The metal volume content of the thin metal wire may be changed in the thickness direction. It is preferred that the metal volume content is lower in the vicinity of the surface than in the center of the thin metal wire.

Figure 2A:
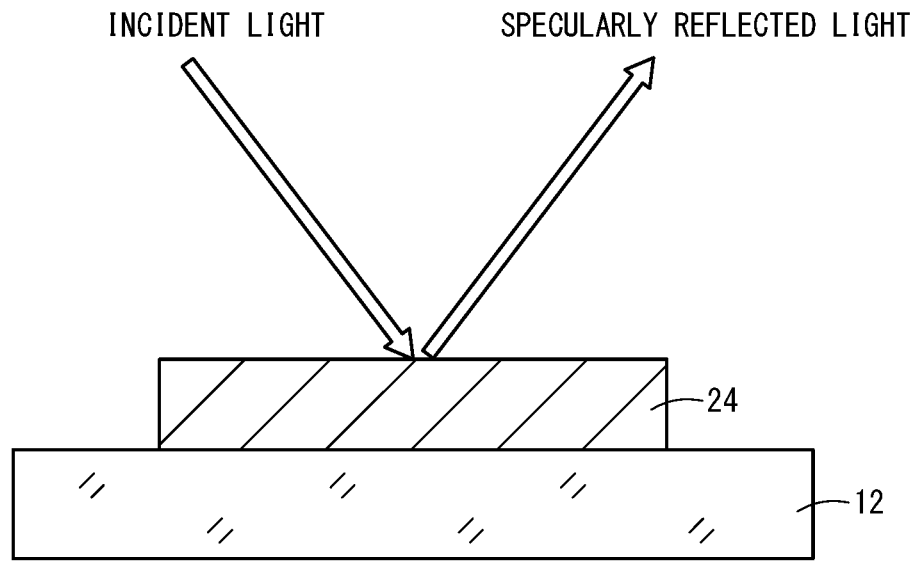
FIG. 2A is an explanatory view for illustrating a behavior of a conventional thin metal wire having a luster surface (with a high specular reflectance)
Figure 3A:
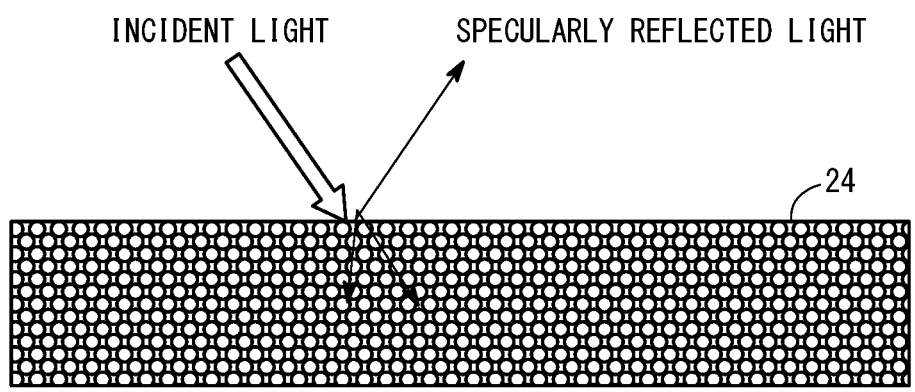
FIG. 3A is an explanatory view for illustrating a behavior of a conventional thin metal wire having a low metal volume content (with a low specular reflectance)
Figure 3B:
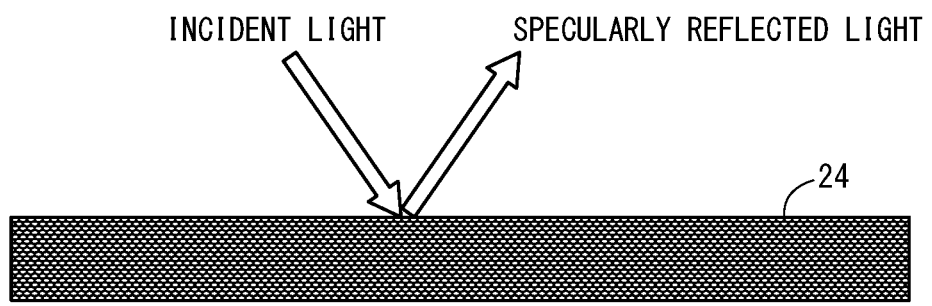
FIG. 3B is an explanatory view for illustrating a behavior of a conventional thin metal wire having a high metal volume content (with a high specular reflectance)

In general, a conventional thin metal wire 24 has a luster surface. Therefore, as shown in FIG. 2A, the surface intensely reflects a visible light, and the ratio of the specularly reflected light to all the reflected lights (specular reflectance) is increased. As a result, the thin metal wire 24 is highly visible disadvantageously. In addition, as shown in FIG. 3A, in a case where the thin metal wire 24 has a low metal volume content, though the incident light is introduced into spaces between metal particles to lower the specular reflectance, the metal particles exhibit a loose connection, thereby resulting in a high electrical resistance or a poor wiring adhesion disadvantageously. The electrical resistance of the electrode portion 18 can be lowered by performing a calender treatment or the like to increase the metal volume content. However, as shown in FIG. 3B, the metal particles are densely arranged on the surface, whereby the specular reflectance is significantly increased and the thin metal wire 24 is made highly visible disadvantageously. Thus, it is difficult to achieve both an appropriate visibility (the thin metal wire 24 being less visible) and a low resistance.

Figure 2B:
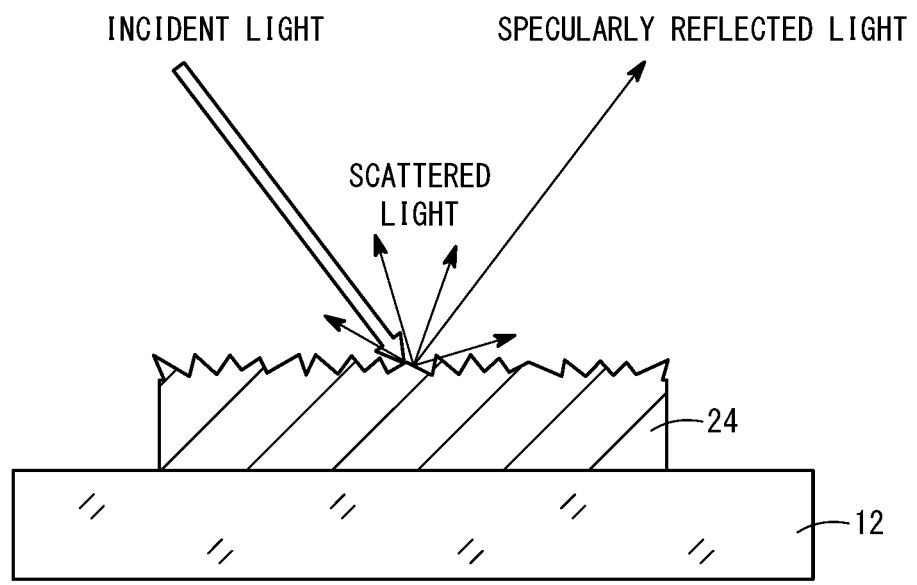
FIG. 2B is an explanatory view for illustrating a behavior of a thin metal wire according to this embodiment having a concave-convex surface (with a low specular reflectance)

In contrast, in this embodiment, the electrode portion 18 has the surface shape satisfying the condition of $Ra^2/Sm > 0.01$ μm. Therefore, as shown in FIG. 2B, the ratio of the scattered lights is increased and the specular reflectance is lowered, whereby the thin metal wire 24 is less visible. Thus, even when the metal volume content is increased to 35% or more, the light reflection from the electrode portion 18 can be reduced. Consequently, both of the appropriate visibility (the thin metal wire 24 being less visible) and the low resistance can be achieved.

Figure 4:
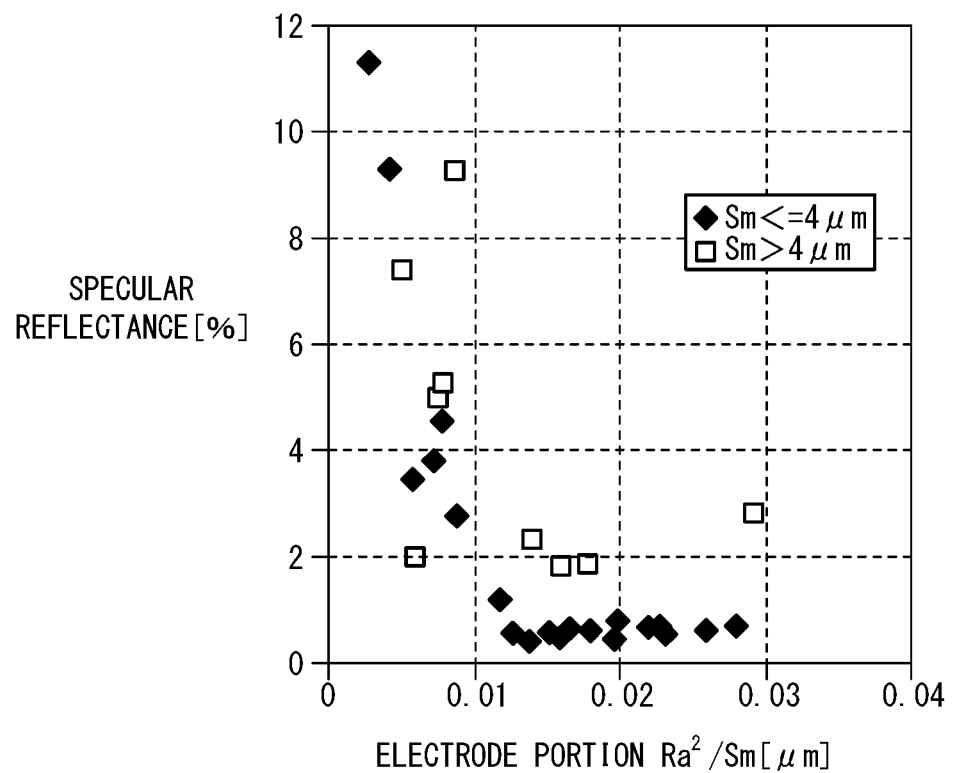
FIG. 4 is a graph plotting a specular reflectance change with respect to $Ra^2/Sm$ of an electrode portion.

In this embodiment, it is preferred that at least the electrode portion 18 has Sm of 4 μm or less. FIG. 4 is a graph plotting a specular reflectance change with respect to $Ra^2/Sm$ of the electrode portion 18. In a case where the electrode portion 18 has a surface shape satisfying the condition of $Ra^2/Sm>0.01$ μm and has Sm of 4 μm or less, the specular reflectance can be reduced to 1.2% or less.

In this embodiment, it is preferred that the electrode portion 18 has a difference of less than 3% between the specular reflectances of the front surface and the back surface. The difference is more preferably less than 1%, further preferably less than 0.5%. The transparent substrate 12 has the surface having the electrode portion 18 and the opposite surface, and the back surface of the electrode portion 18 is the surface that can be observed from the opposite surface side through the transparent substrate 12. The specular reflectances are determined by subtracting the reflectance at the interface between air and the transparent substrate 12.

Figure 5A:
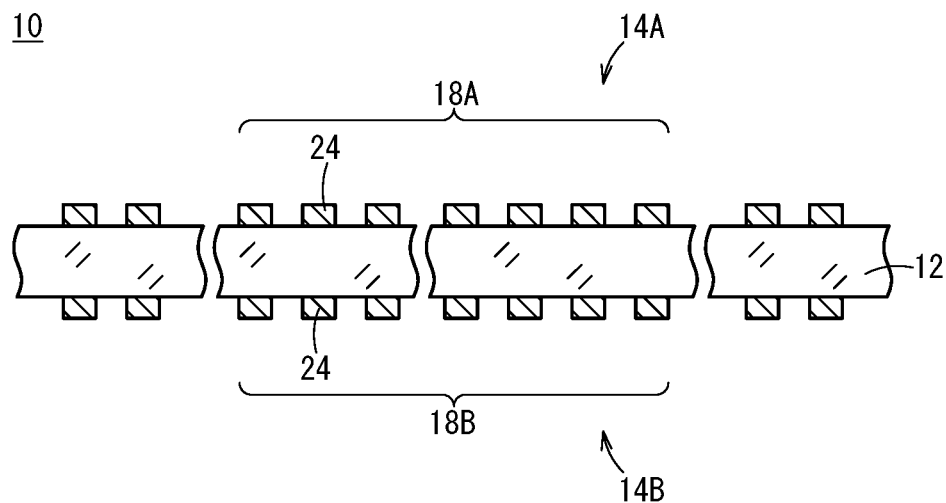
FIG. 5A is a partial cross-sectional view of metal wiring portions (a first metal wiring portion and a second metal wiring portion) formed on the front surface and the back surface of one transparent substrate respectively.

This is effective, for example, in a case where metal wiring portions (a first metal wiring portion 14A and a second metal wiring portion 14B) are formed on the front and back surfaces of one transparent substrate 12 as shown in FIG. 5A.

In the transparent conductive film 10, the front surface of a first electrode portion 18A and the back surface of a second electrode portion 18B, which is observed through the transparent substrate 12, have a specular reflectance difference of less than 3%. Therefore, the thin metal wire 24 in the first electrode portion 18A is less visible, and also the thin metal wire 24 in the second electrode portion 18B is less visible. Consequently, even in a case where the metal wiring portion is formed on each of the front and back surfaces of one transparent substrate 12, the transparent conductive film can have an improved visibility, and the first electrode portion 18A and the second electrode portion 18B can have a low resistance.

Figure 5B:
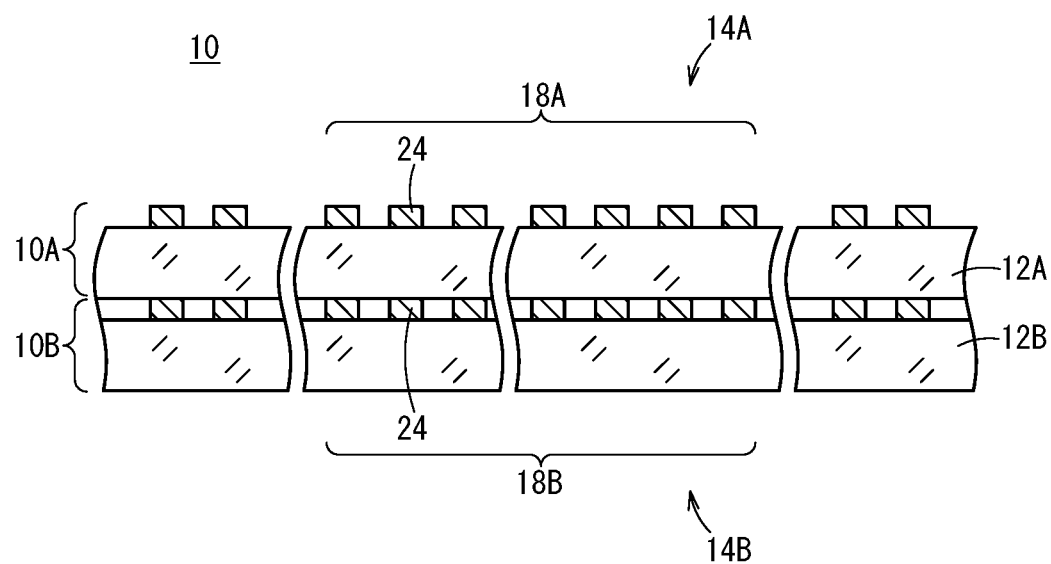
FIG. 5B is a partial cross-sectional view of a stack of two transparent conductive films (a first transparent conductive film and a second transparent conductive film)

As shown in FIG. 5B, two transparent conductive films (a first transparent conductive film 10A and a second transparent conductive film 10B) may be stacked. This structure is preferred because both of the front surface of the first electrode portion 18A in the first transparent conductive film 10A and the front surface of the second electrode portion 18B in the second transparent conductive film 10B can exhibit a low specular reflectance. Thus, even in a case where the first transparent conductive film 10A and the second transparent conductive film 10B are stacked, the transparent conductive film can have an improved visibility, and the first electrode portion 18A and the second electrode portion 18B can have a low resistance.

A representative method for producing the transparent conductive film 10 shown in FIGS. 1A and 1B will be briefly described below.

The transparent conductive film 10 may be produced as follows. For example, a photosensitive material having the transparent substrate 12 and thereon a photosensitive silver halide-containing emulsion layer may be exposed and developed, whereby metallic silver portions and light-transmitting portions may be formed in the exposed areas and the unexposed areas respectively to obtain the metal wiring portion 14. The metallic silver portions may be subjected to a physical development treatment and/or a plating treatment to deposit a conductive metal thereon. The entire layer containing the metallic silver portions and the conductive metal deposited thereon is referred to as the conductive metal portion.

Alternatively, a photosensitive base layer to be plated containing a pre-plating treatment material may be formed on the transparent substrate 12. The resultant layer may be exposed and developed, and may be subjected to a plating treatment, whereby metal portions and light-transmitting portions may be formed in the exposed areas and the unexposed areas respectively to form the metal wiring portion 14. The metal portions may be further subjected to a physical development treatment and/or a plating treatment to deposit a conductive metal thereon.

The following two processes can be preferably used in the method using the pre-plating treatment material. The processes are disclosed more specifically in Japanese Laid-Open Patent Publication Nos. 2003-213437, 2006-064923, 2006-058797, and 2006-135271, etc.

(a) A process comprising applying, to the transparent substrate 12, a base layer to be plated having a functional group interactable with a plating catalyst or a precursor thereof, exposing and developing the layer, and subjecting the developed layer to a plating treatment to form a metal portion on the base material.

(b) A process comprising applying, to the transparent substrate 12, an underlayer containing a polymer and a metal oxide and a base layer to be plated having a functional group interactable with a plating catalyst or a precursor thereof in this order, exposing and developing the layers, and subjecting the developed layers to a plating treatment to form a metal portion on the base material.

Alternatively, a photoresist film on a copper foil disposed on the transparent substrate 12 may be exposed and developed to form a resist pattern, and the copper foil exposed from the resist pattern may be etched to form the metal wiring portion 14.

Alternatively, a paste containing fine metal particles may be printed on the transparent substrate 12 to form the metal wiring portion 14.

Alternatively, a metal film may be vapor-deposited on the transparent substrate 12, a photoresist film may be formed on the metal film, the photoresist film may be exposed and developed to form a mask pattern, and the metal film exposed from the mask pattern may be etched to form the metal wiring portion 14.

Alternatively, the metal wiring portion 14 may be printed on the transparent substrate 12 by using a screen or gravure printing plate.

Alternatively, the metal wiring portion 14 may be formed on the transparent substrate 12 by using an inkjet method.

A method, which contains using a photographic photosensitive silver halide material for producing the transparent conductive film 10 of this embodiment, will be mainly described below.

The method using the photographic photosensitive silver halide material for producing the transparent conductive film 10 includes the following three processes different in the photosensitive materials and development treatments.

(1) A process comprising subjecting a photosensitive black-and-white silver halide material free of physical development nuclei to a chemical or thermal development to form the metallic silver portions on the photosensitive material.

(2) A process comprising subjecting a photosensitive black-and-white silver halide material having a silver halide emulsion layer containing physical development nuclei to a solution physical development to form the metallic silver portions on the material.

(3) A process comprising subjecting a stack of a photosensitive black-and-white silver halide material free of physical development nuclei and an image-receiving sheet having a non-photosensitive layer containing physical development nuclei to a diffusion transfer development to form the metallic silver portions on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver in the state of a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei in the image-receiving sheet, to form a transmittable conductive film such as a light-transmitting conductive film on the sheet. In this process, a so-called separate-type procedure is used, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the transparent conductive film 10 of this embodiment will be described in detail below.
<Support (Transparent Substrate 12)>

The support is not limited as long as it can support conductive portions to be hereinafter described. The support is preferably a transparent support, and particularly preferably a plastic film. In the case of using the transparent support, the transparent conductive film of the present invention can be suitably used as a transparent conductive sheet.

Specifically, for example, the support is preferably a film of a plastic having a melting point of about 290° C. or lower such as a PET (258° C.), polycycloolefin (134° C.), polycarbonate (250° C.), acrylic material (128° C.), PEN (269° C.), PE (135° C.), PP (163° C.), polystyrene (230° C.), polyvinyl chloride (180° C.), polyvinylidene chloride (212° C.), or TAC (290° C.). The PET, polycycloolefin, and polycarbonate are particularly preferred. The numerals in parentheses represent the melting points. The support preferably has a visible light transmittance of 85% to 100% (according to JIS R 3106: 1998).

The thickness of the support is not particularly limited. In general, the thickness of the support may be arbitrarily selected within a range of 25 to 500 μm in view of use in the touch panel, the electromagnetic-shielding film, or the like. In a case where the support acts as a supporting member and a touch surface, the support may have a thickness of more than 500 μm.

In a preferred embodiment, the support is subjected to at least one treatment selected from the group consisting of atmospheric-pressure plasma treatments, corona discharge treatments, and ultraviolet irradiation treatments beforehand. In such a treatment, a hydrophilic group such as an OH group is introduced to a surface of the treated support to improve the adhesion of the conductive portion to be hereinafter described. Among the above treatments, the atmospheric-pressure plasma treatment is preferred from the viewpoint of further improving the adhesion of the conductive portion.
(Binder Portion)

A binder portion is a layer formed at least inside the thin metal wire 24. In a more preferred embodiment, the support surface having the thin metal wire 24 is preferably covered with the thin metal wire 24 and the binder portion. The binder portion preferably contains a macromolecule different from gelatins. The definition of the macromolecule different from the gelatins will be described hereinbelow.

It is preferred that the binder portion is substantially free from the gelatins. The term "substantially free from the gelatins" means that the content of the gelatins in the binder portion is less than 0.002 mg/cm$^2$. The gelatin content is preferably 0.001 mg/cm$^2$ or less, more preferably 0.0005 mg/cm$^2$ or less, in view of preventing ion migration. The lower limit of the gelatin content is not particularly restricted, and is preferably 0 mg/cm$^2$. The gelatin content in the binder portion is the amount of the gelatins contained in a unit area (m$^2$) of a plan projection view, which is obtained by projecting in a direction perpendicular to the surface of the binder portion.

The thickness of the binder portion is not particularly limited, and is generally smaller than the thickness of a conductive thin wire portion. The binder portion may contain a component other than the macromolecule different from the gelatins.

The macromolecule different from the gelatins (hereinafter referred to simply as the macromolecule) is preferably free from proteins. In other words, it is preferred that the macromolecule is not decomposed by a proteolytic enzyme.

More specifically, for example, the binder portion may contain at least one resin selected from the group consisting of acrylic resins, styrene resins, vinyl resins, polyolefin resins, polyester resins, polyurethane resins, polyamide resins, polycarbonate resins, polydiene resins, epoxy resins, silicone resins, cellulose-type polymers, and chitosan-type polymers, and may contain a copolymer of monomers for such resins. Among them, the binder portion may contain at least one resin selected from the group consisting of the acrylic resins, styrene resins, and polyester resins or a copolymer of monomers usable for those resins.

In particular, in a preferred embodiment, the macromolecule may be a polymer (copolymer) represented by the following general formula (1) to further prevent water ingress.

-(A)$_x$-(B)$_y$—(C)$_z$-(D)$_w$-    General formula (1):

In the general formula (1), (A), (B), (C), and (D) represent the following repeating units respectively.

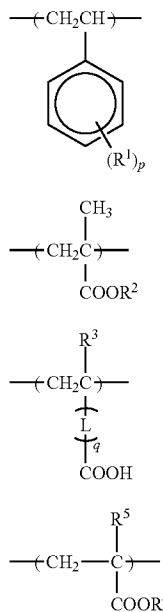

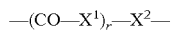

$R^1$ is a methyl group or a halogen atom, preferably a methyl group, a chlorine atom, or a bromine atom. p is an integer of 0 to 2, preferably 0 or 1, more preferably 0.

$R^2$ is a methyl group or an ethyl group, preferably a methyl group. $R^3$ is a hydrogen atom or a methyl group, preferably a hydrogen atom. L is a divalent linking group, preferably a group represented by the following general formula (2).

$$—(CO—X^1)_r—X^2— \quad \text{General formula (2):}$$

In the general formula (2), $X^1$ is an oxygen atom or $—NR^{30}—$. $R^{30}$ is a hydrogen atom, an alkyl group, an aryl group, or an acyl group, and the groups may have a substituent (such as a halogen atom, a nitro group, or a hydroxyl group). $R^{30}$ is preferably a hydrogen atom, an alkyl group having 1 to 10 carbon atoms (such as a methyl group, an ethyl group, an n-butyl group, or an n-octyl group), or an acyl group (such as an acetyl group or a benzoyl group). $X^1$ is particularly preferably an oxygen atom or —NH—.

$X^2$ is an alkylene group, an arylene group, an alkylene-arylene group, an arylene-alkylene group, or an alkylene-arylene-alkylene group, and —O—, —S—, —OCO—, —CO—, —COO—, —NH—, —SO$_2$—, —N(R$^{31}$)—, —N(R$^{31}$)SO$_2$—, or the like may be inserted into these groups. $R^{31}$ is a linear or branched alkyl group having 1 to 6 carbon atoms such as a methyl group, an ethyl group, or an isopropyl group. Preferred examples of $X^2$ include a dimethylene group, a trimethylene group, a tetramethylene group, an o-phenylene group, a m-phenylene group, a p-phenylene group, —CH$_2$CH$_2$OCOCH$_2$CH$_2$—, and —CH$_2$CH$_2$OCO(C$_6$H$_4$)—.

r is 0 or 1.

q is 0 or 1, preferably 0.

$R^4$ is an alkyl, alkenyl, or alkynyl group having 5 to 80 carbon atoms, preferably an alkyl group having 5 to 50 carbon atoms, more preferably an alkyl group having 5 to 30 carbon atoms, further preferably an alkyl group having 5 to 20 carbon atoms.

$R^5$ is a hydrogen atom, a methyl group, an ethyl group, a halogen atom, or —CH$_2$COOR$^6$, preferably a hydrogen atom, a methyl group, a halogen atom, or —CH$_2$COOR$^6$, more preferably a hydrogen atom, a methyl group, or —CH$_2$COOR$^6$, particularly preferably a hydrogen atom.

$R^6$ is a hydrogen atom or an alkyl group having 1 to 80 carbon atoms, and may be the same as or different from $R^4$. The carbon number of $R^6$ is preferably 1 to 70, more preferably 1 to 60.

In the general formula (1), x, y, z, and w represents the molar ratios of the repeating units.

x is 3 to 60 mol %, preferably 3 to 50 mol %, more preferably 3 to 40 mol %.

y is 30 to 96 mol %, preferably 35 to 95 mol %, and particularly preferably 40 to 90 mol %.

In a case where z is excessively low, the polymer exhibits a low affinity for a hydrophilic protective colloid such as a gelatin, whereby generation of an aggregation or peeling defect of a matting agent is increased. In a case where z is excessively high, the matting agent is disadvantageously dissolved in an alkaline processing liquid for a photosensitive material. Therefore, z is 0.5 to 25 mol %, preferably 0.5 to 20 mol %, and particularly preferably 1 to 20 mol %.

w is 0.5 to 40 mol %, preferably 0.5 to 30 mol %.

In the general formula (1), it is particularly preferred that x is 3 to 40 mol %, y is 40 to 90 mol %, z is 0.5 to 20 mol %, and w is 0.5 to 10 mol %.

The polymer represented by the general formula (1) is preferably a polymer represented by the following general formula (3).

General formula (3)

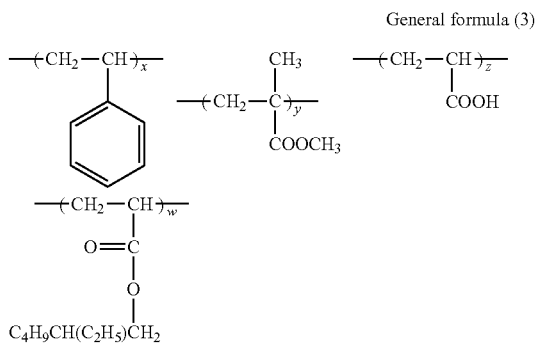

In the general formula (3), x, y, z, and w have the same meanings as above.

The polymer represented by general formula (1) may contain a repeating unit other than those of (A), (B), (C), and (D) above. Examples of monomers for forming the other repeating units include acrylic acid esters, methacrylic acid esters, vinyl esters, olefins, crotonic acid esters, itaconic acid diesters, maleic acid diesters, fumaric acid diesters, acrylamide-based compounds, unsaturated carboxylic acids, allyl compounds, vinyl ethers, vinyl ketones, heterocyclic vinyl compounds, glycidyl esters, and unsaturated nitriles. Such monomers are described also in [0010] to [0022] of Japanese Patent No. 3754745.

From the viewpoint of hydrophobicity, the monomer is preferably an acrylic acid ester or a methacrylic acid ester, more preferably a hydroxyalkyl methacrylate or acrylate such as hydroxyethyl methacrylate. The polymer represented by general formula (1) preferably contains a repeating unit represented by the general formula (E) in addition to the repeating units of the formulae (A), (B), (C), and (D).

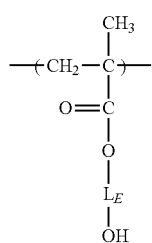

E

In the general formula (E), $L_E$ is an alkylene group, preferably an alkylene group having 1 to 10 carbon atoms, more preferably an alkylene group having 2 to 6 carbon atoms, further preferably an alkylene group having 2 to 4 carbon atoms.

The polymer represented by general formula (1) is particularly preferably a polymer represented by the following general formula (4).

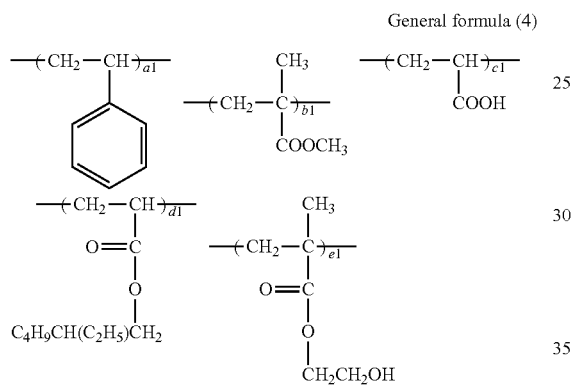

General formula (4)

In the general formula (4), a1, b1, c1, d1, and e1 represents the molar ratios of the monomer units. a1 is 3 to 60 (mol %), b1 is 30 to 95 (mol %), c1 is 0.5 to 25 (mol %), d1 is 0.5 to 40 (mol %), and e1 is 1 to 10 (mol %).

The preferred range of a1 is the same as that of x, the preferred range of b1 is the same as that of y, the preferred range of c1 is the same as that of z, and the preferred range of d1 is the same as that of w.

e1 is 1 to 10 mol %, preferably 2 to 9 mol %, more preferably 2 to 8 mol %.

Specific examples of the polymer represented by general formula (1) are shown below without intention of restricting the present invention thereto.

(P-1)

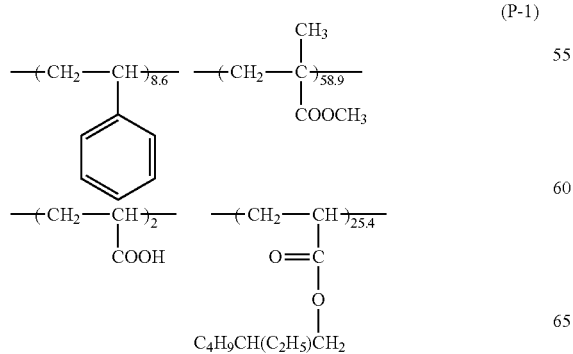

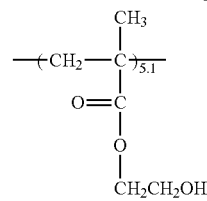

(P-2)

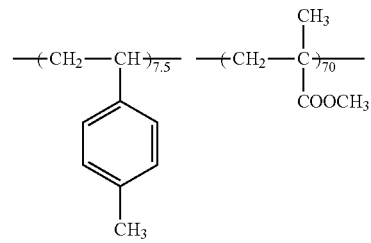

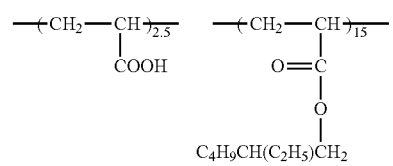

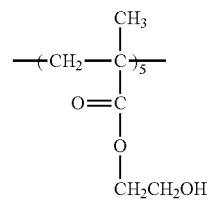

(P-3)

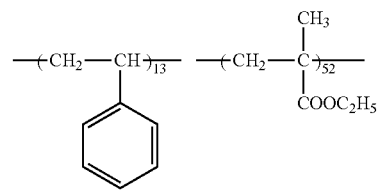

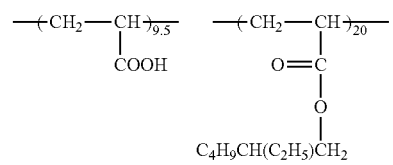

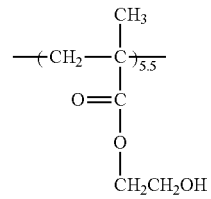

(P-4)

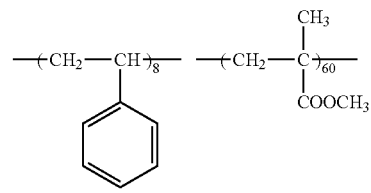

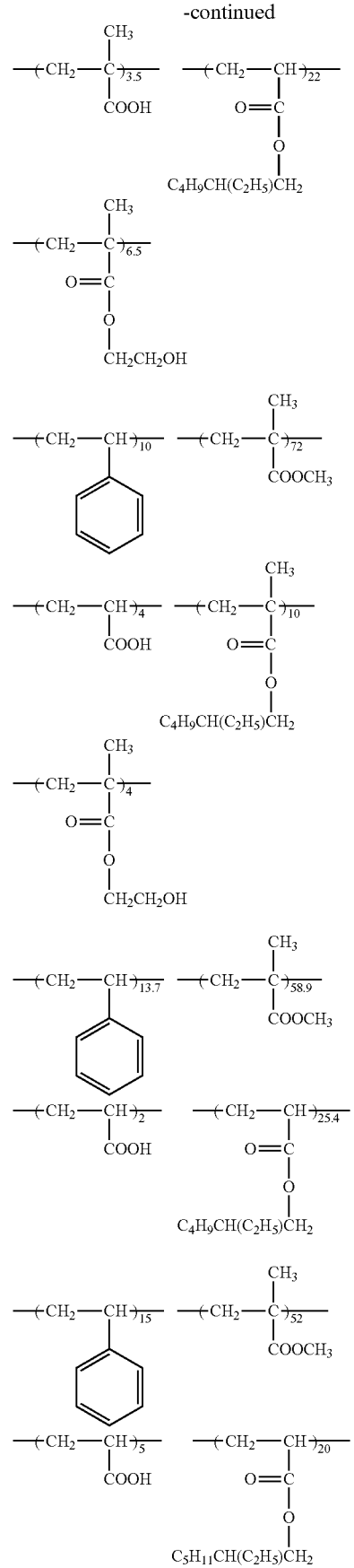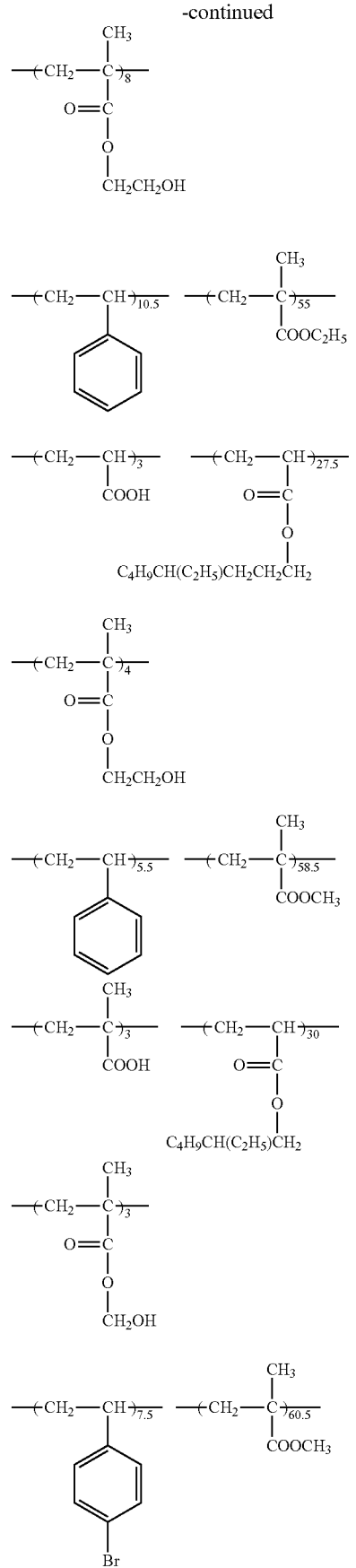

-continued

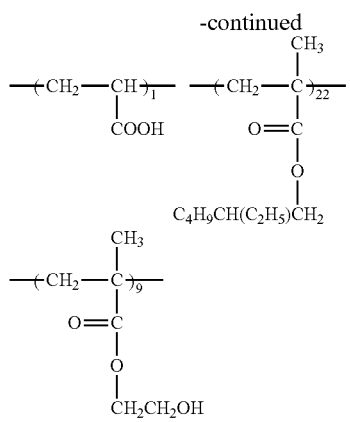

The weight-average molecular weight of the polymer represented by general formula (1) is preferably 1,000 to 1,000,000, more preferably 2,000 to 750,000, further preferably 3,000 to 500,000.

The polymer represented by general formula (1) may be synthesized according to Japanese Patent Nos. 3305459 and 3754745, etc.

<Solvent>

The solvent used for forming the silver salt emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

<Other Additives>

The additives used in this embodiment are not particularly limited, and may be preferably selected from known additives.

[Other Layers]

A protective layer (not shown) may be formed on the silver salt emulsion layer. In addition, an undercoat layer or the like may be formed below the silver salt emulsion layer.

The steps for producing the transparent conductive film 10 will be described below.

[Exposure]

In this embodiment, the mesh pattern 28 may be formed in a printing process, and may be formed by exposure and development treatments, etc. in another process. Thus, a photosensitive material having the transparent substrate 12 and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt sheets, photographic papers, print engraving sheets, emulsion masks for photomasking, and the like may be used in the present invention.

In the present invention, the development process may include a fixation treatment for removing the silver salt in the unexposed areas to stabilize the material. Fixation treatment technologies for photographic silver salt sheets, photographic papers, print engraving sheets, emulsion masks for photomasking, and the like may be used in the present invention. The developed and fixed photosensitive material is preferably subjected to a water washing treatment or a stabilization treatment.

The ratio of the metallic silver portions contained in the exposed areas after the development to the silver contained in the areas before the exposure is preferably 50% or more, more preferably 80% or more by mass. In a case where the ratio is 50% or more by mass, a high conductivity can be achieved.

The transparent conductive film 10 can be obtained by the above steps. The surface resistance of the resultant transparent conductive film 10 is preferably 0.1 to 300 ohm/sq. Preferred surface resistance ranges of the transparent conductive film 10 depend on the use of the transparent conductive film 10. In the case of using the transparent conductive film 10 in the electromagnetic-shielding material, the surface resistance is preferably 10 ohm/sq or less, more preferably 0.1 to 3 ohm/sq. In the case of using the transparent conductive film 10 in the touch panel, the surface resistance is preferably 1 to 70 ohm/sq, more preferably 5 to 50 ohm/sq, further preferably 5 to 30 ohm/sq. The transparent conductive film 10 may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited thereon by a physical development treatment and/or a plating treatment. In this embodiment, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention. The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the line width of the conductive metal portion (the line width Wb of the thin metal wire 24) may be selected within a range of 30 μm or less. In the case of using the transparent conductive film 10 as the electromagnetic-shielding film, the line width of the thin metal wire 24 is preferably 1 to 20 µm, more preferably 1 to 9 µm, further preferably 2 to 7 µm. In the case of using the transparent conductive film 10 as the conductive film in the touch panel, the lower limit of the line width is preferably 1 µm or more, 3 µm or more, 4 µm or more, or 5 µm or more, and the upper limit thereof is preferably 15 µm or less, 10 µm or less, 9 µm or less, or 8 µm or less. In a case where the line width Wb is less than the lower limit, the conductive metal portion has an insufficient conductivity, whereby the touch panel using the conductive metal portion has insufficient detection sensitivity. On the other hand, in a case where the line width is more than the upper limit, moire is significantly generated due to the conductive metal portion, and the touch panel using the conductive metal portion has a poor visibility. On the condition that the line width is within the above range, the moire of the conductive metal portion is improved, and the visibility is remarkably improved. The thin wire pitch (the arrangement pitch of the thin metal wire 24) is preferably 100 to 400 µm, further preferably 150 to 300 µm, most preferably 210 to 250 µm. The metal wiring 20 in the wiring portion 22 may have a part with a line width of more than 200 µm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the thin metal wire 24 to the entire conductive metal portion. For example, a square lattice pattern having a line width of 6 µm and a thin wire pitch of 240 µm has an opening ratio of 95%.

[Light-Transmitting Portion]

In this embodiment, the light-transmitting portion is a portion having a light transmittance, other than the conductive metal portions in the transparent conductive film 10. The visible light transmittance of the light-transmitting portion is 80% or more, preferably 90% or more, more preferably 95% or more, further preferably 97% or more, most preferably 98% or more.

The exposure is preferably carried out using a glass mask method or a laser lithography pattern exposure method.

[Transparent Conductive Film 10]

In the transparent conductive film 10 of this embodiment, the thickness of the transparent substrate 12 is preferably 5 to 350 µm, more preferably 30 to 150 µm. On the condition that the thickness is within the range of 5 to 350 µm, a desired visible light transmittance can be obtained, and the transparent substrate 12 can be easily handled.

The thickness of the metallic silver portion formed on the transparent substrate 12 may be appropriately selected by controlling the thickness of the coating liquid for the silver salt-containing layer applied to the transparent substrate 12. The thickness of the metallic silver portion may be selected within a range of 0.001 µm to 0.2 mm, and is preferably 30 µm or less, more preferably 20 µm or less, further preferably 0.01 to 9 µm, most preferably 0.05 to 5 µm. The metallic silver portion is preferably formed in a patterned shape. The metallic silver portion may have a monolayer structure or a multilayer structure containing two or more layers. In a case where the metallic silver portion has a patterned multilayer structure containing two or more layers, the layers may have different wavelength color sensitivities. In this case, different patterns can be formed in the layers by using exposure lights with different wavelengths.

In the case of using the transparent conductive film 10 in the touch panel, the conductive metal portion preferably has a smaller thickness. As the thickness is reduced, the viewing angle and visibility of the display panel 16a are improved. Thus, the thickness of the layer of the conductive metal on the conductive metal portion is preferably smaller than 9 µm, more preferably 0.1 µm or more but smaller than 5 µm, further preferably 0.1 µm or more but smaller than 3 µm.

In this embodiment, the metallic silver portion can be formed with a desired thickness by controlling the coating thickness of the silver salt-containing layer, and the thickness of the layer of the conductive metal particles can be controlled in the physical development treatment and/or the plating treatment, whereby the transparent conductive film 10 having a thickness of smaller than 5 µm (preferably less than 3 µm) can be easily produced.

The plating or the like is not necessarily carried out in the method for producing the transparent conductive film 10 of this embodiment. This is because the desired surface resistance can be obtained by controlling the applied silver amount and the silver/binder volume ratio of the silver salt emulsion layer in the method for producing the transparent conductive film 10 of this embodiment.

[Debindering Treatment]

The debindering treatment is a process of treating the support (the transparent substrate 12) having the conductive portion (at least the electrode portion 18) with a proteolytic enzyme, an oxidizing agent such as an oxo acid, or the like, for decomposing a water-soluble binder such as a gelatin. In this process, the water-soluble binder such as the gelatin is decomposed and removed from the exposed and developed photosensitive layer to further prevent the ion migration in the thin metal wire 24.

Substances for use in this process will be described in detail, and then the procedures of this process will be described in detail below.

(Proteolytic Enzyme)

The proteolytic enzyme (hereinafter referred to also as the enzyme) may be a known plant or animal enzyme capable of hydrolyzing a protein such as the gelatin. For example, the proteolytic enzyme may be a pepsin, rennin, trypsin, chymotrypsin, cathepsin, papain, ficin, thrombin, renin, collagenase, bromelain, bacterial protease, or the like. The proteolytic enzyme is particularly preferably the trypsin, papain, ficin, or bacterial protease. In particular, the bacterial protease is easily available, and for example, Bioprase manufactured by Nagase & Co., Ltd. is known as an inexpensive commercial product.

(Oxidizing Agent)

The oxidizing agent may be a known agent capable of oxidatively decomposing the protein such as the gelatin. For example, the oxidizing agent may be a salt of a halogen and an oxo acid, such as a hypochlorite, chlorite, or chlorate. In particular, sodium hypochlorite is inexpensive and commercially-available with ease.

(Reduction Treatment)

In the case of using the oxidizing agent for decomposing the gelatin, the metal in the thin metal wire 24 may be oxidized to increase the electrical resistance. Therefore, it is preferred that a reduction treatment is carried out in combination with the oxidizing agent treatment. The type of an aqueous reducing solution used for the reduction treatment is not particularly limited as long as reduction of silver can be reduced by the solution. For example, the aqueous reducing solution may be an aqueous solution of sodium sulfite, hydroquinone, p-phenylenediamine, oxalic acid, ascorbic acid, sodium borohydride, or the like. It is further preferred that the aqueous solution has pH of 10 or more.

The treatment method is not particularly limited, and the support having the conductive portion may be brought into contact with the aqueous reducing solution. For example, the support may be immersed in the aqueous reducing solution to achieve the contact.

The conductivity can be further increased by the reduction treatment. Therefore, the reduction treatment may be preferably carried out even in a case where the gelatin decomposition with the oxidizing agent is not carried out.

(Process Procedure)

The procedure of the debindering treatment process is not particularly limited as long as the support having the conductive portion can be brought into contact with the enzyme or the oxidizing agent. In particular, the procedure is not particularly limited as long as the conductive and non-conductive portions on the support can be brought into contact with the enzyme. In general, the support having the conductive portion may be brought into contact with a treatment liquid containing the enzyme (an enzyme liquid). For example, to achieve the contact, the treatment liquid may be applied to the support having the conductive portion, or alternatively the support having the conductive portion may be immersed in the treatment liquid.

The enzyme content of the treatment liquid is not particularly limited, and may be appropriately selected depending on the ability and desired performance of the enzyme used. The ratio of the enzyme to the total of the treatment liquid is preferably about 0.05% to 20% by mass, more preferably 5% to 10% by mass, to easily control the degree of the decomposition and removal of the gelatin.

The treatment liquid may contain, in addition to the enzyme, a pH buffer, an antibacterial compound, a wetting agent, a preservative, etc. if necessary.

The pH of the treatment liquid is selected by an experiment for maximizing the activity of the enzyme. In general, the pH is preferably 5 to 7. Also the temperature of the treatment liquid is preferably a temperature suitable for increasing the activity of the enzyme, and may be 25° C. to 45° C. specifically.

The contact time is not particularly limited, and is preferably 10 to 500 seconds, more preferably 90 to 360 seconds, in which the conductive portion exhibits more excellent ion migration prevention.

After the treatment with the treatment liquid, the support having the conductive portion may be washed with a warm water if necessary. In this process, residues of the decomposed gelatin, the proteolytic enzyme, the oxidizing agent, and the like can be removed to further prevent the ion migration.

The washing method is not particularly limited as long as the support having the conductive portion can be brought into contact with the warm water. For example, the support having the conductive portion may be immersed in the warm water, or alternatively the warm water may be applied onto the support having the conductive portion.

The optimum temperature of the warm water may be appropriately selected depending on the type of the proteolytic enzyme used. The temperature is preferably 20° C. to 80° C., more preferably 40° C. to 60° C., in view of productivity.

The contact time (washing time) of the warm water and the support having the conductive portion is not particularly limited. The contact time is preferably 1 to 600 seconds, more preferably 30 to 360 seconds, in view of productivity.

[Calender Treatment]

After the development treatment or the gelatin removal treatment, the thin metal wire 24 is smoothened by a calender treatment. The calender treatment may be carried out in a case where the metal wiring portion 14 is formed on the transparent substrate 12 by using the photographic photosensitive silver halide material. In addition, the calender treatment may be carried out in the following cases:

(a) a case where the metal wiring portion 14 is formed on the transparent substrate 12 by the plating treatment;

(b) a case where the metal wiring portion 14 is formed by selectively etching the copper foil on the transparent substrate 12;

(c) a case where the metal wiring portion 14 is formed by printing the paste containing the fine metal particles on the transparent substrate 12;

(d) a case where the metal wiring portion 14 is formed by vapor-depositing the metal film on the transparent substrate 12 and then selectively etching the metal film;

(e) a case where the metal wiring portion 14 is formed by printing using the screen or gravure printing plate on the transparent substrate 12; and (f) a case where the metal wiring portion 14 is formed on the transparent substrate 12 by using the inkjet method.

In particular, the calender treatment is effective in a case where the surface 12$a$ of the transparent substrate 12 (the surface on which the metal wiring portion 14 is formed) is a flat surface. The metal volume content of the metal wiring portion 14 is increased to significantly increase the conductivity by the calender treatment. In the case of performing the above debindering treatment, substances inhibiting the metal connection are reduced, whereby the conductivity increase effect of the calender treatment is enhanced.

Figure 6A:
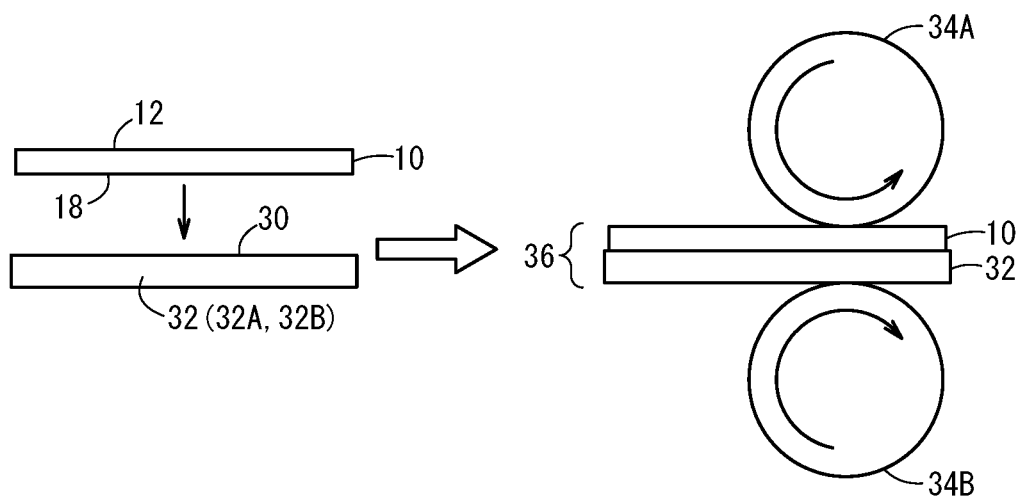
FIG. 6A is an explanatory view for illustrating a first method of a calender treatment.
Figure 6B:
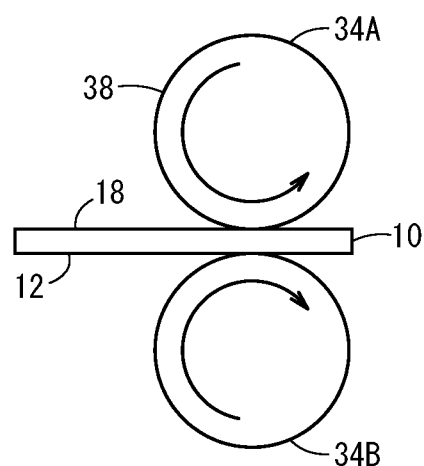
FIG. 6B is an explanatory view for illustrating a second method of the calender treatment.

Examples of such calender treatments include a first method shown in FIG. 6A and a second method shown in FIG. 6B.

As shown in FIG. 6A, a mat member 32 having a concave-convex surface 30 and a pair of calender rollers arranged facing each other (a first calender roller 34A and a second calender roller 34B) are used in the first method. A metal plate 32A or a resin film 32B may be used as the mat member 32. Examples of such metal plates 32A include chromium-plated stainless plates and nitride iron plates, and examples of such resin films 32B include PET (polyethylene terephthalate) films. In particular, the resin film 32B is preferably used because the resin film 32B can be conveyed in the form of a roll together with a roll of the transparent conductive film 10 to achieve a high productivity. A metal roller or a resin roller is used as each of the first calender roller 34A and the second calender roller 34B. The resin roller contains an epoxy, polyimide, polyamide, polyimideamide, etc. The metal roller and the resin roller may be used in combination. At least one of the first calender roller 34A and the second calender roller 34B may have a crown shape, the diameter of the roller center being larger than the diameters of the roller ends.

The transparent conductive film 10 is placed on the surface 30 (the concave-convex surface) of the mat member 32. In this step, the transparent conductive film 10 is placed on the surface 30 of the mat member 32 to obtain one stack 36 in such a manner that the electrode portion 18 in the transparent conductive film 10 faces the surface 30 of the mat member 32. The stack 36 is interposed between the first calender roller 34A and the second calender roller 34B arranged facing each other. The first calender roller 34A and the second calender roller 34B are rotated, the first calender roller 34A is brought into contact with the transparent substrate 12 in the transparent conductive film 10, the second calender roller 34B is brought into contact with the mat member 32, and the transparent conductive film 10 is pressure-treated while being conveyed in one direction.

As shown in FIG. 6B, a roller having a roughened surface is used as at least one of the first calender roller 34A and the second calender roller 34B without using the mat member 32 in the second method. In this example, a surface 38 of the first calender roller 34A, with which the electrode portion 18 of the transparent conductive film 10 is brought into contact, is roughened.

The transparent conductive film 10 is interposed between the first calender roller 34A and the second calender roller 34B arranged facing each other, and the first calender roller 34A and the second calender roller 34B are rotated. Then, the surface 38 of the first calender roller 34A is brought into contact with the electrode portion 18 in the transparent conductive film 10, and the second calender roller 34B is brought into contact with the transparent substrate 12, whereby the transparent conductive film 10 is pressure-treated while being conveyed in one direction.

In the second method, the transparent conductive film 10 can be continuously calender-treated in the form of a roll, and the resin film 32B is not wasted. Therefore, as compared with the first method, the second method is more preferred from the viewpoints of production rate and cost.

In the calender treatment, the lower limit of the line pressure is preferably 1960 N/cm (200 kgf/cm, corresponding to a surface pressure of 699.4 kgf/cm$^2$) or more, further preferably 2940 N/cm (300 kgf/cm, corresponding to a surface pressure of 935.8 kgf/cm$^2$) or more. The upper limit of the line pressure is 6880 N/cm (700 kgf/cm) or less.

The calender treatment is preferably carried out at a temperature of 10° C. (without temperature control) to 100° C. Though the preferred treatment temperature range depends on the density and shape of the mesh pattern 28 of the thin metal wire 24 or the metal wirings 20 in the wiring portion 22, the type of the binder, etc., the temperature is more preferably 10° C. (without temperature control) to 50° C. in general.

It is preferred that the concave-convex surface shapes of the mat member 32 (the metal plate) used in the first method and the first calender roller 34A (the metal roller) used in the second method have an Ra$^2$/Sm value of more than 0.015 μm.

Alternatively, it is preferred that the concave-convex surface shapes of the mat member 32 (the metal plate) used in the first method and the first calender roller 34A (the metal roller) used in the second method have an Sm value equal to or smaller than the line width Wb of the thin metal wire 24, an Ra value equal to or smaller than ⅙ of the thickness of the thin metal wire 24 measured before the calender treatment, and an Ra$^2$/Sm value of more than 0.015 μm.

Figure 7:
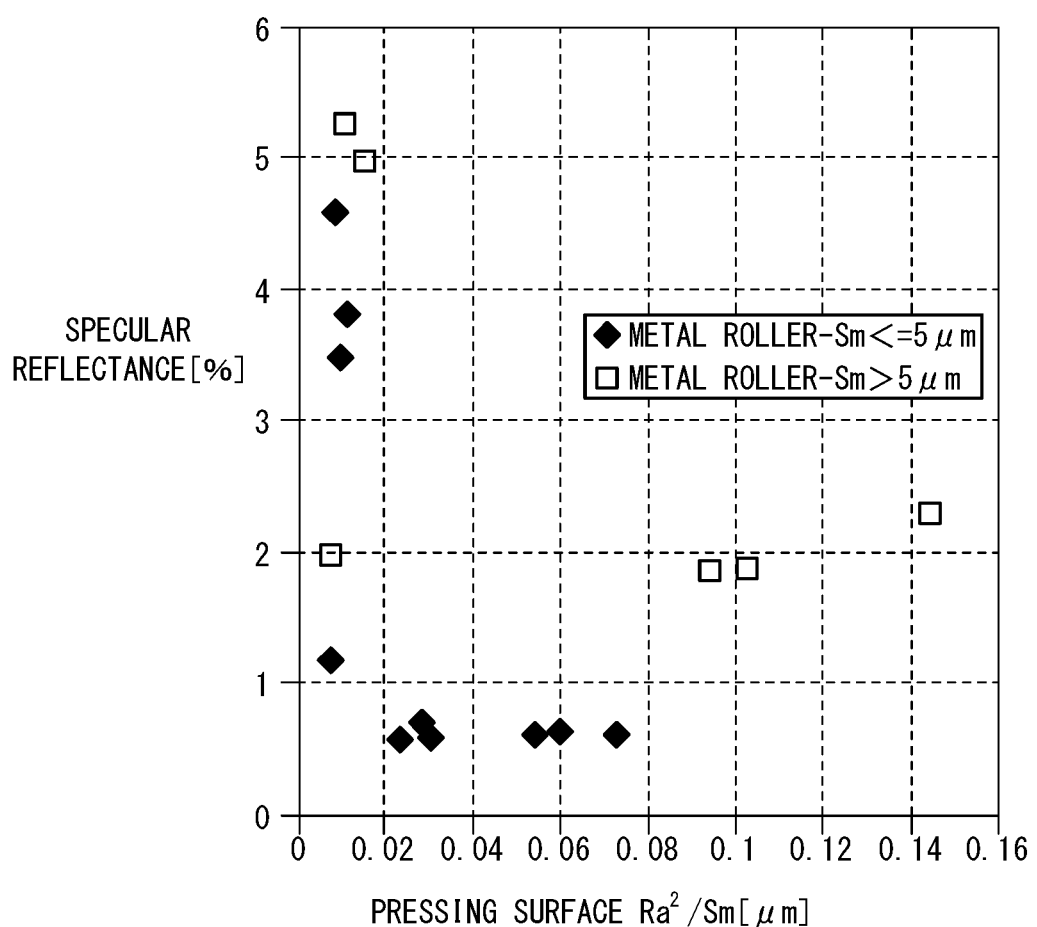
FIG. 7 is a graph plotting a specular reflectance change with respect to $Ra^2/Sm$ of a pressing surface of a metal roller in each of a case where the Sm value of the metal roller is equal to or smaller than the line width of a thin metal wire and a case where the Sm value of the metal roller is larger than the line width.

FIG. 7 is a graph plotting specular reflectance changes with respect to the Ra$^2$/Sm value of the pressing surface of the metal roller in a case where the Sm value of the metal roller is equal to or smaller than the line width Wb of the thin metal wire 24 and in a case where the Sm value of the metal roller is larger than the line width Wb of the thin metal wire 24, the line width Wb of the thin metal wire 24 being 5 μm. As is clear from FIG. 7, in the case where the Sm value of the metal roller is equal to or smaller than the line width Wb of the thin metal wire 24, though the specular reflectance is 3.8% at Ra$^2$/Sm of 0.015 μm, the specular reflectance can be reduced to less than 1% at Ra$^2$/Sm of more than 0.015 μm. Of course, even when the Sm value is larger than the line width Wb of the thin metal wire 24, the specular reflectance can be reduced more efficiently at Ra$^2$/Sm of more than 0.015 μm than at Ra$^2$/Sm of 0.015 μm or less.

The operation, which varies depending on the relationships of the line width Wb and the thickness (the thickness tc before the calender treatment) of the thin metal wire 24 and the Sm and Ra values of the metal plate 32A or the metal roller, will be described below with reference to FIGS. 8A to 8D.

Figure 8A:
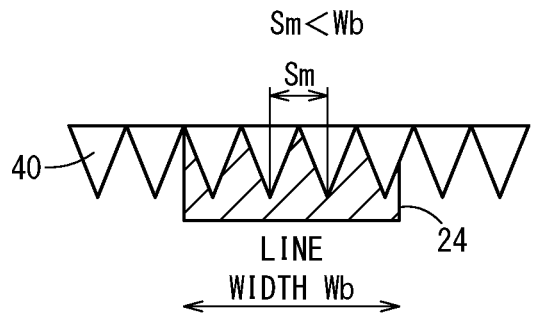
FIGS. 8A and 8B are each an explanatory view for illustrating the relationship between the Sm value of a metal plate or a metal roller and the line width of a thin metal wire.

As shown in FIG. 8A, in a case where the Sm value of the metal plate 32A or the metal roller is equal to or smaller than the line width Wb of the thin metal wire 24, a convex portion 40 of the metal plate 32A or the metal roller is naturally brought into contact with the thin metal wire 24. This is suitable for improving the visibility.

Figure 8B:
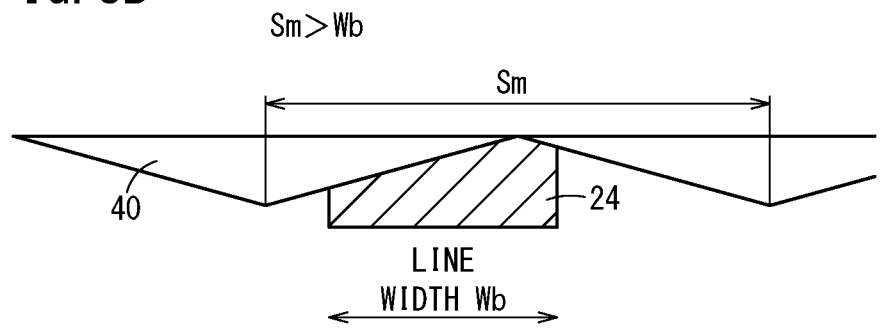

As shown in FIG. 8B, in a case where the Sm value of the metal plate 32A or the metal roller is larger than the line width Wb of the thin metal wire 24, the probability of the contact between the convex portion 40 of the metal plate 32A or the metal roller and the thin metal wire 24 is decreased. Furthermore, the convex portion 40 has a lower inclination angle. Therefore, though breakage of the thin metal wire 24 is reduced, the visibility cannot be easily improved in some cases.

Figure 8C:
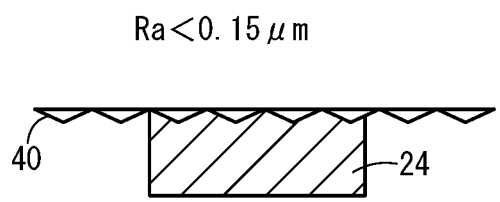
FIGS. 8C and 8D are each an explanatory view for illustrating the relationship between the Ra value of the metal plate or the metal roller and the thickness of the thin metal wire.

As shown in FIG. 8C, in a case where the Ra value of the metal plate 32A or the metal roller is less than 0.15 μm, the effect of diffusing the specularly reflected light is lowered due to the small irregularity. Therefore, the Ra value of the metal plate 32A or the metal roller is preferably 0.15 μm or more.

Figure 8D:
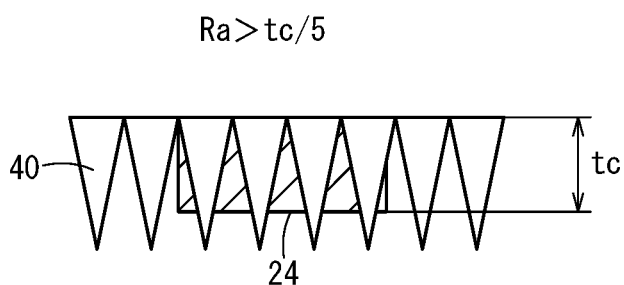

As shown in FIG. 8D, in a case where the Ra value of the metal plate 32A or the metal roller is larger than tc/5, in which tc is the thickness of the thin metal wire 24 measured before the calender treatment, the probability of the breakage in the thin metal wire 24 is increased. Therefore, the Ra value of the metal plate 32A or the metal roller is preferably equal to or smaller than tc/5, in which tc is the thickness of the thin metal wire 24 measured before the calender treatment.

Figure 9:
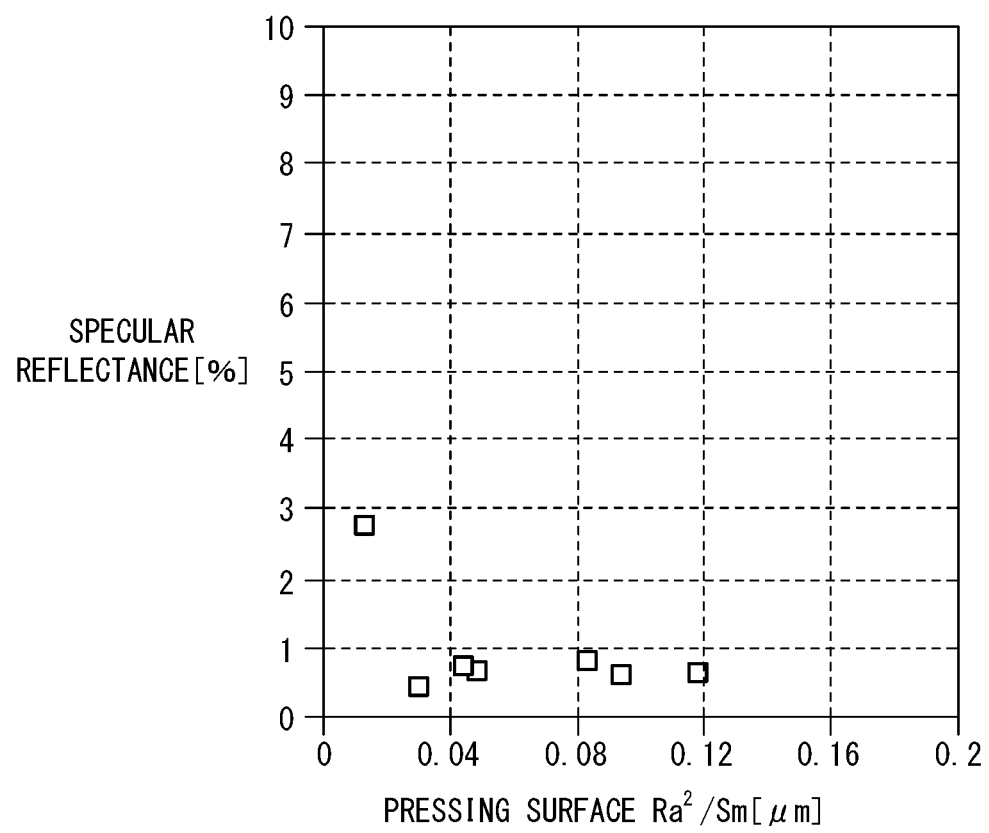
FIG. 9 is a graph plotting a specular reflectance change with respect to $Ra^2/Sm$ of a pressing surface of a resin film.

In the case of using the mat member 32 (the resin film 32B) in the first method, the concave-convex surface shape of the resin film 32B preferably has an Ra value of more than 0.15 μm. Furthermore, the concave-convex surface shape of the resin film 32B preferably has an Ra$^2$/Sm value of more than 0.01 μm. FIG. 9 is a graph plotting a specular reflectance change with respect to the Ra$^2$/Sm value of the pressing surface of the resin film 32B. As is clear from FIG. 9, though the specular reflectance is 2.8% at Ra$^2$/Sm of 0.01 μm in the pressing surface of the resin film 32B, the specular reflectance can be reduced to less than 1% at Ra$^2$/Sm of more than 0.01 μm.

Incidentally, because the concave-convex surface of the resin film 32B is deformed, the resin film 32B cannot be used repeatedly. Nevertheless, because the deformed resin film 32B does not pass through the electrode portion 18 (the thin metal wire 24) in the transparent conductive film 10, the calender treatment can be performed without wire breakage unlike in the case of using the metal plate 32A or the metal roller. Thus, the Ra range has no upper limit. However, in a case where the Ra value is larger than ¼ of the thickness tc of the thin metal wire 24 measured before the calender treatment, the resistance lowering in the calender treatment is reduced. Therefore, the Ra value is preferably equal to or smaller than ¼ of the thickness tc of the thin metal wire 24 before the calender treatment, more preferably equal to or smaller than ⅙ thereof. The Ra value of the resin film 32B is preferably 0.15 μm or more. In the case where the Ra value is less than 0.15 μm, the light reflection may be increased, and the pattern may become highly visible.

[Other Production Methods]

In addition to the above production method, a method of forming the metal wiring portion 14 on the transparent substrate 12 having a concave-convex surface 12a can be preferably used. In this case, in the surface 12a, only a portion corresponding to the electrode portion 18 may have the concave-convex shape. Of course, the entire surface 12a may have the concave-convex shape. Consequently, in the case where the metal wiring portion 14 is formed on the surface 12a of the transparent substrate 12, the concave-convex shape of the surface 12a of the transparent substrate 12 is transferred to at least a surface of the electrode portion 18.

The surface 12a of the transparent substrate 12 preferably has a shape with an Ra value of more than 0.15 μm. Furthermore, the surface 12a preferably has an $Ra^2/Sm$ value of more than 0.01 μm. In this case, in the resultant transparent conductive film, at least the electrode portion 18 can have the surface shape satisfying the condition of $Ra^2/Sm>0.01$ μm, and the metal volume content can be 35% or more.

The method using the plating treatment to form the metal wiring portion 14 on the transparent substrate 12, the method containing vapor-depositing the metal film on the transparent substrate 12 and selectively etching the metal film to form the metal wiring portion 14, or the like can be preferably used for forming the metal wiring portion 14 on the transparent substrate 12 having the concave-convex surface 12a. The methods are particularly preferred because it is capable of forming the metal wiring portion 14 with a high metal volume content.

[Silver Fusion Treatment]
(Light Irradiation Process)

After the development treatment and any one of the above-described processes, a light irradiation process for irradiating the conductive portion (at least the electrode portion 18) with a pulsed light from a xenon flash lamp is preferably carried out. This process is capable of lowering the resistance of the conductive portion. The reason for the conductivity improvement in the transparent conductive film 10 is not clear, but it is presumed that the macromolecule and/or the gelatin are evaporated at least partially by heat under the irradiation with the pulsed light from the xenon flash lamp, whereby the metal (conductive substance) components are readily connected with each other.

The irradiation amount of the pulsed light is not particularly limited, and is preferably 1 to 1500 J, more preferably 100 to 1000 J, further preferably 500 to 800 J, per 1 pulse. The irradiation amount can be measured using a common ultraviolet intensity meter such as an illuminance meter having a detection peak at 300 to 400 nm.

For example, in the case of using the transparent conductive film 10 as the electrode for the touch panel, it is preferred that the thin metal wire 24 has a line width of 1 to 15 μm and a thickness of 1 to 3 μm, so that the conductive portion is not visible to the naked eye. In the case of using such line width and thickness, the conductive portion is irradiated with the pulsed light preferably 1 to 2000 times, more preferably 1 to 50 times, further preferably 1 to 30 times.

(Heating Process)

After the development treatment and any one of the above-described processes, a heating treatment process for heating the support (the transparent substrate 12) having the conductive portion (at least the electrode portion 18) is preferably carried out. By performing this process, the transparent conductive film 10 can be obtained with an improved conductivity in the conductive portion, an excellent adhesion of the thin metal wire 24, and an ion migration inhibition ability. Furthermore, this process is capable of reducing the haze of the transparent conductive film 10, improving the adhesion of the conductive portion, improving a surface property in the oxidation treatment, or lowering the surface resistance.

The heating treatments include a treatment of contacting the support having the conductive portion with a superheated vapor. The superheated vapor may be a superheated water vapor or a mixture of a superheated water vapor and another gas.

It is preferred that the superheated vapor is in contact with the conductive portion within a supply time range of 10 to 70 seconds. On the condition that the supply time is 10 seconds or more, the conductivity is greatly improved. The conductivity improvement reaches a saturation point at a supply time of about 70 seconds. Therefore, the supply time of more than 70 seconds is not preferred from the viewpoint of economic efficiency. The supply amount of the superheated vapor to be brought into contact with the conductive portion is preferably 500 to 600 $g/m^3$, and the temperature of the superheated vapor is preferably controlled within a range of 100° C. to 160° C. at 1 atm.

The heating treatment may be carried out at 80° C. to 150° C. The heating time is not particularly limited, and is preferably 0.1 to 5.0 hours, more preferably 0.5 to 1.0 hour, in view of achieving more excellent effect.

[Stabilization Treatment]

After the development treatment and any one of the above-described processes, a process for bringing a migration inhibitor into contact with the support having the conductive portion is preferably carried out. By performing this process, the metallic silver in the conductive portion is stabilized, the ion migration is sufficiently reduced, and the reliability in a high-humidity and high-temperature environment is improved.

The migration inhibitor for this process may be a known substance. For example, the migration inhibitor is preferably a nitrogen-containing heterocyclic compound or an organic mercapto compound, particularly preferably a nitrogen-containing heterocyclic compound.

The nitrogen-containing heterocyclic compound is preferably a 5- or 6-membered azole compound, particularly preferably a 5-membered azole compound.

For example, the heterocycle may be a tetrazole ring, a triazole ring, an imidazole ring, a thiadiazole ring, an oxadiazole ring, a selenadiazole ring, an oxazole ring, a triazole ring, a benzoxazole ring, a benzthiazole ring, a benzimidazole ring, a pyrimidine ring, a triazaindene ring, a tetraazaindene ring, a pentaazaindene ring, or the like.

These rings may have a substituent. The substituent may be a nitro group, a halogen atom (such as a chlorine or bromine atom), a mercapto group, a cyano group, an alkyl group (such as a methyl, ethyl, propyl, t-butyl, or cyanoethyl group), an aryl group (such as a phenyl, 4-methansulfonamidophenyl, 4-methylphenyl, 3,4-dichlorphenyl, or naphthyl group), an alkenyl group (such as an allyl group), an aralkyl group (such as a benzyl, 4-methylbenzyl, or phenethyl group), a sulfonyl group (such as a methanesulfonyl, ethanesulfonyl, or p-toluenesulfonyl group), a carbamoyl group (such as an unsubstituted carbamoyl, methylcarbamoyl, or phenylcarbamoyl group), a sulfamoyl group (such as an unsubstituted sulfamoyl, methylsulfamoyl, or phenylsulfamoyl group), a carbonamide group (such as an acetamide or benzamide group), a sulfonamide group (such as a methanesulfonamide, benzenesulfonamide, or p-toluenesulfonamide group), an acyloxy group (such as an acetyloxy or benzoyloxy group), a sulfonyloxy group (such as a methanesulfonyloxy group), a ureido group (such as an unsubstituted ureido, methylureido, ethylureido, or phenylureido group), an acyl group (such as an acetyl or benzoyl group), an oxycarbonyl group (such as a methoxycarbonyl or phenoxycarbonyl group), an oxycarbonylamino group (such as a methoxycarbonylamino, phenoxycarbonylamino, or 2-ethylhexyloxycarbonylamino group), a hydroxyl group, or the like, and the groups may be further substituted or unsubstituted. One ring may have a plurality of the substituents.

Preferred specific examples of the nitrogen-containing heterocyclic compounds include imidazole, benzimidazole, benzindazole, benzotriazole, benzoxazole, benzothiazole, pyridine, quinoline, pyrimidine, piperidine, piperazine, quinoxaline, and morpholine. These compounds may have a substituent such as an alkyl group, a carboxyl group, or a sulfo group.

The nitrogen-containing 6-membered heterocyclic compound preferably has a triazine ring, a pyrimidine ring, a pyridine ring, a pyrroline ring, a piperidine ring, a pyridazine ring, or a pyrazine ring, particularly preferably has a triazine ring or a pyrimidine ring. The nitrogen-containing 6-membered heterocyclic compound may have a substituent, which may be a lower alkyl group having a carbon number of 1 to 6 (more preferably 1 to 3), a lower alkoxy group having a carbon number of 1 to 6 (more preferably 1 to 3), a hydroxyl group, a carboxyl group, a mercapto group, an alkoxyalkyl group having a carbon number of 1 to 6 (more preferably 1 to 3), a hydroxyalkyl group having a carbon number of 1 to 6 (more preferably 1 to 3), etc.

Preferred specific examples of the nitrogen-containing 6-membered heterocyclic compounds include triazine, methyltriazine, dimethyltriazine, hydroxyethyltriazine, pyrimidine, 4-methylpyrimidine, pyridine, and pyrroline.

The organic mercapto compound may be an alkylmercapto compound, an arylmercapto compound, a heterocyclic mercapto compound, or the like. The alkylmercapto compound may be cysteine, thiomalic acid, or the like, the arylmercapto compound may be thiosalicylic acid or the like, and the heterocyclic mercapto compound may be 2-phenyl-1-mercaptotetrazole, 2-mercaptobenzimidazole, 2-mercaptobenzothiazole, 2-mercaptobenzoxazole, 2-mercaptopyrimidine, 2,4-dimercaptopyrimidine, 2-mercaptopyridine, or the like. These compounds may have a substituent such as an alkyl group, a carboxyl group, or a sulfo group.

A method for bringing the migration inhibitor into contact with the support having the conductive portion is not particularly limited. For example, the migration inhibitor may be applied to the support, or alternatively the support having the conductive portion may be immersed in the migration inhibitor.

The migration inhibitor may be dissolved in a solvent to prepare a solution if necessary. The type of the solvent is not particularly limited, and the solvent may be selected from above-described examples for the photosensitive layer forming composition. The contact time is not particularly limited, and is preferably 0.5 to 10 minutes, more preferably 1.0 to 3.0 minutes.

(Organic Solvent Contact Process)

After the development treatment and any one of the above-described processes, a process for bringing the support having the conductive portion into contact with an organic solvent is preferably carried out. By performing this process, a macromolecule film remaining in the conductive portion or the non-conductive portion can be further densified, the transparent conductive film 10 can be obtained with an excellent ion migration inhibition ability, and the haze of the transparent conductive film 10 can be reduced.

The type of the organic solvent to be used is not particularly limited, and an optimum solvent may be selected depending on the type of the macromolecule. In particular, the organic solvent is preferably a solvent in which the macromolecule can be dissolved to further improve the above effect. The dissolution means that at least 5 g of the macromolecule is dissolved in 1 L (liter) of the organic solvent. In particular, the organic solvent preferably has an SP value of 8 to 12. Specific examples of the organic solvents include benzyl alcohol, ethanol, toluene, methyl ethyl ketone, acetone, and ethyl acetate.

The method for contacting the support having the conductive portion with the organic solvent is not particularly limited, and may be selected from known methods. For example, the organic solvent may be applied to the support, or alternatively the support having the conductive portion may be immersed in the organic solvent. The organic solvent contact time is not particularly limited, and is preferably 10 to 60 minutes, more preferably 15 to 30 minutes.

[Other Optional Process]

After the development treatment and any one of the above-described processes, the physical development treatment and/or the plating treatment for depositing the conductive metal particles on the conductive portion may be carried out to improve the conductivity of the conductive portion. In the present invention, the conductive metal particles may be deposited on the conductive portion by only one of the physical development and plating treatments or by the combination of the treatments.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention.

In this embodiment, the plating treatment may contain electroless plating (such as chemical reduction plating or displacement plating). Known electroless plating technologies for printed circuit boards, etc. may be used in this embodiment. The electroless plating is preferably electroless copper plating.

The present invention may be appropriately combined with technologies described in the following patent publications and international patent pamphlets shown in Tables 1 and 2. "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2006-228469 |
| 2007-235115 | 2007-207987 | 2006-012935 | 2006-010795 | 2007-072171 |
| 2006-332459 | 2009-21153 | 2007-226215 | 2006-261315 | 2006-324203 |
| 2007-102200 | 2006-228473 | 2006-269795 | 2006-336090 | 2006-336099 |
| 2006-228478 | 2006-228836 | 2007-009326 | 2007-201378 | 2007-335729 |
| 2006-348351 | 2007-270321 | 2007-270322 | 2007-178915 | 2007-334325 |
| 2007-134439 | 2007-149760 | 2007-208133 | 2007-207883 | 2007-013130 |
| 2007-310091 | 2007-116137 | 2007-088219 | 2008-227351 | 2008-244067 |
| 2005-302508 | 2008-218784 | 2008-227350 | 2008-277676 | 2008-282840 |
| 2008-267814 | 2008-270405 | 2008-277675 | 2008-300720 | 2008-300721 |
| 2008-283029 | 2008-288305 | 2008-288419 | 2009-21334 | 2009-26933 |
| 2009-4213 | 2009-10001 | 2009-16526 | 2008-171568 | 2008-198388 |
| 2008-147507 | 2008-159770 | 2008-159771 | 2008-235224 | 2008-235467 |
| 2008-218096 | 2008-218264 | 2008-224916 | 2008-252046 | 2008-277428 |
| 2008-241987 | 2008-251274 | 2008-251275 | 2007-129205 | |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

First Example

In Examples 1 to 15 and Comparative Examples 1 to 14, various properties were evaluated under various surface shapes of mat members used in a calender treatment.

Example 1

[Preparation of Silver Halide Emulsion]

Liquid 1 was maintained at 38° C. and pH 4.5, and 90% of the total amounts of Liquids 2 and 3 were simultaneously added to Liquid 1 over 20 minutes under stirring to form 0.16-μm nuclear particles. Then, Liquids 4 and 5 were added thereto over 8 minutes, and residual 10% of Liquids 2 and 3 were added over 2 minutes, so that the nuclear particles were grown to 0.21 μm. Further 0.15 g of potassium iodide was added thereto, and the resulting mixture was aged for 5 minutes to complete the particle formation.

| <Liquid 1> | |
|---|---|
| Water | 750 ml |
| Gelatin | 8.6 g |
| Sodium chloride | 3.1 g |
| 1,3-Dimethylimidazolidine-2-thione | 20 mg |
| Sodium benzenethiosulfonate | 10 mg |
| Citric acid | 0.7 g |

| <Liquid 2> | |
|---|---|
| Water | 300 ml |
| Silver nitrate | 150 g |

| <Liquid 3> | |
|---|---|
| Water | 300 ml |
| Sodium chloride | 38 g |
| Potassium bromide | 32 g |
| Potassium hexachloroiridate (III) (0.005% KCl, 20% aqueous solution) | 5 ml |
| Ammonium hexachlororhodate (0.001% NaCl, 20% aqueous solution) | 7 ml |

| <Liquid 4> | |
|---|---|
| Water | 100 ml |
| Silver nitrate | 50 g |

| <Liquid 5> | |
|---|---|
| Water | 100 ml |
| Sodium chloride | 13 g |
| Potassium bromide | 11 g |
| Potassium ferrocyanide | 5 mg |

The resultant was water-washed by a common flocculation method. Specifically, the temperature was lowered to 35° C., the pH was lowered by sulfuric acid until the silver halide was precipitated (within a pH range of 3.6±0.2), and about 3 L of the supernatant solution was removed (first water washing). Further 3 L of a distilled water was added thereto, sulfuric acid was added until the silver halide was precipitated, and 3 L of the supernatant solution was removed again (second water washing). The procedure of the second water washing was repeated once more (third water washing), whereby the water washing and desalting process was completed. After the water washing and desalting process, the obtained emulsion was controlled at a pH of 6.3 and a pAg of 7.4. 2.5 g of a gelatin, 10 mg of sodium benzenethiosulfonate, 3 mg of sodium benzenethiosulfinate, 15 mg of sodium thiosulfate, and 10 mg of chlorauric acid were added thereto, whereby the emulsion was chemically sensitized at 55° C. to obtain the optimum sensitivity. Further 100 mg of a stabilizer of 1,3,3a,7-tetraazaindene and 100 mg of an antiseptic agent of PROXEL (trade name, available from ICI Co., Ltd.) were added thereto, to obtain a final emulsion of cubic silver iodochlorobromide particles, which contained 0.08 mol % of silver iodide and silver chlorobromide including 70 mol % of silver chloride and 30 mol % of silver bromide, and had an average particle diameter of 0.21 μm and a variation coefficient of 9.5%.

(Preparation of Composition for Forming Photosensitive Layer)

$1.2 \times 10^{-4}$ mol/mol-Ag of 1,3,3a,7-tetraazaindene, $1.2 \times 10^{-2}$ mol/mol-Ag of hydroquinone, $3.0 \times 10^{-4}$ mol/mol-Ag of citric acid, 0.90 g/mol-Ag of a sodium salt of 2,4-dichloro-6-hydroxy-1,3,5-triazine, and a trace of a film hardener were added to the emulsion, and the pH of the resultant coating liquid was controlled to 5.6 using citric acid.

The polymer (P-1) included in the above specific examples of the polymers represented by the general formula (1) and a disperser of a dialkylphenyl PEO sulfuric ester were added to the gelatin in the coating liquid. The amount of a crosslinking agent was controlled in such a manner that a crosslinking agent content of 0.09 g/m² was obtained in a photosensitive silver halide-containing layer to be hereinafter described. A composition for forming a photosensitive layer was prepared in this manner.

The polymer (P-1) was synthesized with reference to Japanese Patent Nos. 3305459 and 3754745.

(Step of Forming Photosensitive Layer)

The above polymer latex was applied to a 100-μm polyethylene terephthalate (PET) film (a transparent substrate 12), to form an undercoat layer having a thickness of 0.05 μm.

Then, a composition for forming a silver halide-free layer, which contained a mixture of the polymer latex and a gelatin, was applied to the undercoat layer, to form a silver halide-free layer with a thickness of 1.0 μm. The mixing ratio of the polymer to the gelatin (the polymer/gelatin ratio) was 2/1 by mass, and the content of the polymer was 0.65 g/m².

The composition for forming the photosensitive layer was applied to the silver halide-free layer, to form a photosensitive silver halide-containing layer with a thickness of 2.5 µm. The photosensitive silver halide-containing layer had a polymer content of 0.22 g/m².

A composition for forming a protective layer, which contained a mixture of the polymer latex and a gelatin, was applied to the photosensitive silver halide-containing layer, to form a protective layer with a thickness of 0.15 µm. The mixing ratio of the polymer to the gelatin (the polymer/gelatin ratio) was 0.1/1 by mass, and the content of the polymer was 0.015 g/m².

(Exposure and Development Treatments)

Figure 10A:
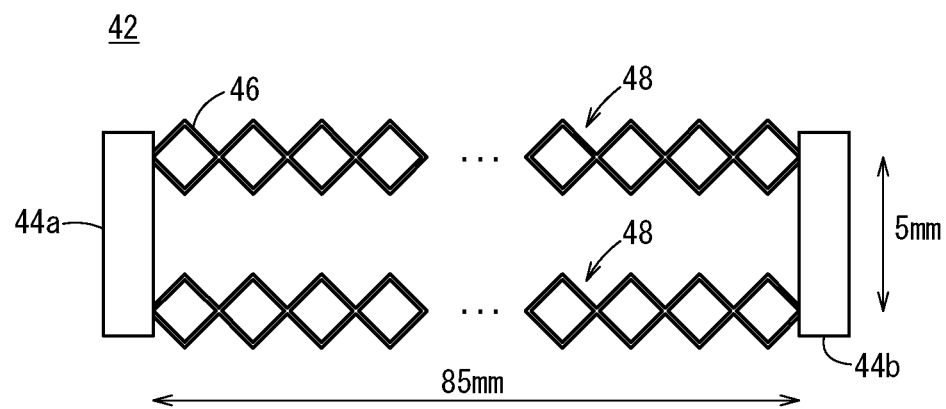
FIG. 10A is a plan view of a mesh pattern electrode formed in a mesh sample.
Figure 10B:
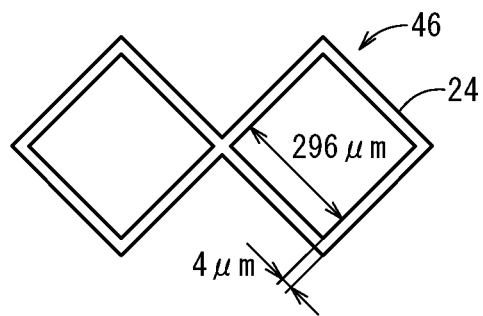
FIG. 10B is a plan view for illustrating the size of a square lattice in the mesh pattern electrode.

Thus-obtained photosensitive layer was exposed to a parallel light from a light source of a high-pressure mercury lamp through a photomask having a square lattice pattern for forming a conductive pattern containing two square lattices arranged in parallel with a ratio of conductive portion/non-conductive portion being 4.0 µm/296 µm (hereinafter referred to also as a mesh pattern electrode 42). The mesh pattern electrode 42 is schematically shown in FIG. 10A. In the structure of the mesh pattern electrode 42, two electrode patterns 48, which each contain twenty square lattices 46 connected in one direction between two terminals 44a and 44b, are arranged in parallel. Thus, the mesh pattern electrode 42 contains forty square lattices 46 in total. Dot ellipsis shown in the center of each electrode pattern 48 means that the square lattices 46 are continuously connected. The distance between the electrode patterns 48 is 5 mm, and the distance between the terminals 44a and 44b is 85 mm. As shown in FIG. 10B, the thin metal wires 24 in the square lattices 46 have a line width Wb of 4 µm, and the distance between the thin metal wires 24 in each square lattice 46 (the side length of the light-transmitting portion) is 296 µm.

After the exposure, the exposed layer was developed using the following developer, fixed using a fixer N3X-R for CN16X (trade name, available from FUJIFILM Corporation), rinsed with pure water, and dried, to obtain a sample having the mesh pattern electrode 42 with a thickness tc of 2.5 µm (hereinafter referred to as the mesh sample). In a continuity test, a tester was attached to the terminals 44a and 44b on the mesh pattern electrode 42 to measure the wiring resistance.

Furthermore, the photosensitive layer was prepared in the same manner as above and exposed without the photomask. Then, the exposed layer was developed, fixed, rinsed, and dried in the same manner as the mesh pattern electrode 42, to obtain a sample without the pattern for a light reflection property measurement (hereinafter referred to as the solid sample).

(Developer Composition)

1 liter (L) of the developer contained the following compounds.

| | |
|---|---|
| Hydroquinone | 0.037 mol/L |
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Gelatin Decomposition Treatment)

Each of the mesh sample and the solid sample was immersed for 90 seconds in an aqueous solution containing 0.36 mM (mmol/L) of sodium hypochlorite, and rinsed with pure water.

(Reduction Treatment)

Each of the mesh sample and the solid sample was immersed for 360 seconds in the following reduction treatment liquid, washed with pure water, and dried.
<Composition of Reduction Treatment Liquid>

1 liter (L) of the reduction treatment liquid contained the following compounds.

| | |
|---|---|
| Hydroquinone | 0.20 mol/L |
| Potassium hydroxide | 0.45 mol/L |
| Potassium carbonate | 0.24 mol/L |

(Calender Treatment)

A metal plate 32A (stainless plate) having a surface shape with Ra of 0.28 µm and Sm of 1.87 µm was used as a mat member 32 for the calender treatment. In the calender treatment, the mesh sample having a width of 6 cm was placed on the metal plate 32A, and a jack pressure of 11.4 MPa was applied to the stack using a calender apparatus containing a combination of a metal roller having a diameter of 95 mm and a mirror-finished surface and a resin roller having a diameter of 95 mm while the stack was conveyed at a rate of 120 mm/minute. The solid sample was subjected to the calender treatment in the same manner.

(Heating Treatment)

Each of the mesh sample and the solid sample was treated for 130 seconds with a superheated vapor bath having a temperature of 120° C., to obtain a mesh sample and a solid sample according to Example 1.

[Various Evaluations]

(Surface Shape Evaluation)

The surface shape properties (Ra and Sm) of the solid samples and mat members 32 (metal plates 32A and resin films 32B) used in the calender treatment were measured as follows.

First, in each of the mat members 32 and the solid samples, micrographs of arbitrarily-selected five areas were taken at an object lens magnification of 100 using an ultra-deep shape measuring microscope VK8550 available from KEYENCE. Then, the horizontal line roughnesses (147 µm) of two positions in each area were measured using a shape analysis application of the microscope (JIS-B-0601-1994). The minimum and maximum values were removed from ten values measured in each of the mat members 32 and the solid samples, and the average of the remaining eight values was considered as the line roughness of each sample. Ra represents an arithmetic average roughness determined in this manner, and Sm represents an average distance between convex portions. In the roughness measurement, tilt correction of the sample was performed if necessary, but cutoff setting and smoothing of the roughness curve were not performed.

(Volume Content Evaluation)

The metal volume content of the solid sample was measured as follows. First, the solid sample was punched, and the punched solid sample having a size of 1 cm square was immersed and stirred at the room temperature for 30 minutes in 100 cc of a solution, which was prepared by mixing 150 cc of 10% sulfuric acid, 8 g of cerium sulfate tetrahydrate, and 300 cc of pure water. Complete decoloration of the solid sample was confirmed, and then the amount of the silver eluted into the solution was measured using an ICP mass spectrometer (ICPM-8500 available from Shimadzu Corporation) to obtain the silver amount per unit area W [g/m²] in the coating film.

Then, the solid sample was cut by a microtome, and the cut surface was observed by a scanning electron microscope SEM (JSM-6500F available from JEOL Ltd.) Ten areas were arbitrarily selected and observed to measure the average thickness H [m] of the silver layer.

The silver amount per unit volume of the silver layer in the solid sample was calculated by W/H [g/m$^3$]. In a case where the silver layer is free from voids and organic substances, the volume content is 100%, and the metallic silver density is $10.49 \times 10^{-6}$ g/cm$^3$ (Essential Chemical Dictionary, 1999, Tokyo Kagaku Dojin). Therefore, the silver volume content of the silver layer was calculated by W/H/$(10.49 \times 10^{-6}) \times 100$ [%].

(Optical Property Evaluation)

<Specular Reflectance>

The specular reflectance of the solid sample was measured as follows. First, the reflection spectrum was measured using an ultraviolet and visible spectrophotometer V660 (a single reflection measurement unit SLM-736) available from JASCO Corporation under conditions of a measurement wavelength of 350 to 800 nm and an incident angle of 5 degrees. In this measurement, a specularly reflected light of an aluminum-vapor-deposited plane mirror was used for a baseline. The Y value in a 2 degree field of a D65 light source in the XYZ color system (the color-matching function according to JIS Z9701-1999) was calculated as the specular reflectance from the obtained reflection spectrum using a color calculation program available from JASCO Corporation.

In a case where the specular reflectance is less than 3%, advantageously the thin metal wire 24 in the mesh pattern electrode 42 is less visible. In a case where the specular reflectance is less than 1%, further advantageously the thin metal wire 24 is significantly less visible. In a case where the specular reflectance is 3% or more, the thin metal wire 24 is highly visible and is not suitable for practical use.

<Total Light Transmittance>

The total light transmittance of the solid sample was measured as follows. First, the total light reflection spectrum including the specularly reflected light and diffusion lights was measured using an ultraviolet and visible spectrophotometer V660 (an integrating sphere unit ISV-722) available from JASCO Corporation within a measurement wavelength range of 350 to 800 nm. In this measurement, Spectralon™ available from Labsphere was used as a standard white plate for a baseline. The Y value in a 2 degree field of a D65 light source in the XYZ color system (the color-matching function according to JIS Z9701-1999) was calculated as the total light transmittance from the obtained reflection spectrum using a color calculation program available from JASCO Corporation.

<Visual Detection Difficulty of Pattern>

The calender-treated surface of the mesh sample was attached to a white glass plate by a 50-μm transparent optical adhesive film (8146-2 available from 3M Company). Furthermore, a 100-μm PET film was attached to the other surface of the mesh sample by the same 50-μm transparent optical adhesive film. The mesh sample, sandwiched between the glass and the PET film, was placed on a black paper surface in such a manner that the thin metal wire 24 was at the front, i.e. the glass surface was the uppermost surface. The visual detection difficulty of the pattern was comprehensively evaluated under irradiation of a fluorescent lamp or a solar light while changing the directions of the light incidence and pattern observation.

A: The mesh pattern was less visible, and did not cause practical problems.

B: The mesh pattern was visible at a particular angle under the intense light source (sunlight), but did not cause practical problems.

C: The mesh pattern was visible at a particular angle even under the weak light source (fluorescent lamp), but did not cause practical problems.

D: The light reflection of the mesh pattern was highly visible, and causes a practical problem.

(Continuity Evaluation)

The electrical resistance of the wiring in the mesh pattern electrode 42 was measured using a digital multi-meter (M3500 available from PICOTEST). Five samples of the mesh pattern electrode 42 shown in FIG. 10A were prepared, and the average of the measured resistance values of the samples was considered as the wiring resistance of the mesh pattern electrode 42. The obtained wiring resistance value was divided by that of Comparative Example 1, in which the calender treatment was not carried out, and was evaluated as compared with Comparative Example 1. When a mesh pattern electrode was evaluated as "D", this sample could not achieve a function as the transparent conductive film. Thus, the sample could not transmit the visible lights and could not achieve an electric continuity, and was judged not to be a transparent conductive film.

A: The wiring resistance value was at most 0.4 times as large as that of the mesh wiring of Comparative Example 1.

B: The wiring resistance value was at most 1.0 time as large as that of the mesh wiring of Comparative Example 1.

C: The wiring resistance value was more than 1.0 time as large as that of the mesh wiring of Comparative Example 1.

D: The wiring resistance value was excessively high and could not be measured.

(Adhesion Evaluation)

The adhesion of the solid sample was evaluated by a cross-cut test according to JIS-K-5600. The adhesion was evaluated according to the following criteria.

A: Peeling was not caused.

D: Peeling was caused.

Example 2

A mesh sample and a solid sample of Example 2 were produced in the same manner as Example 1 except for using a metal plate 32A having a surface shape with Ra of 0.23 μm and Sm of 2.16 μm (a chromium-plated stainless plate) as the mat member 32 in the calender treatment.

Example 3

A mesh sample and a solid sample of Example 3 were produced in the same manner as Example 1 except for using a metal plate 32A having a surface shape with Ra of 0.20 μm and Sm of 2.21 μm (a chromium-plated stainless plate) as the mat member 32 in the calender treatment.

Example 4

A mesh sample and a solid sample of Example 4 were produced in the same manner as Example 1 except for using a metal plate 32A having a surface shape with Ra of 1.29 μm and Sm of 11.54 μm (a chromium-plated stainless plate) as the mat member 32 in the calender treatment.

Example 5

A mesh sample and a solid sample of Example 5 were produced in the same manner as Example 1 except for using a metal plate 32A having a surface shape with Ra of 1.08 μm and Sm of 12.32 μm (a chromium-plated stainless plate) as the mat member 32 in the calender treatment.

Example 6

A mesh sample and a solid sample of Example 6 were produced in the same manner as Example 1 except for using a metal plate 32A having a surface shape with Ra of 1.82 μm and Sm of 13.91 μm (a chromium-plated stainless plate) as the mat member 32 in the calender treatment.

Example 7

A mesh sample and a solid sample of Example 7 were produced in the same manner as Example 1 except for using a metal plate 32A having a surface shape with Ra of 1.27 μm and Sm of 15.58 μm (a chromium-plated stainless plate) as the mat member 32 in the calender treatment.

Example 8

A mesh sample and a solid sample of Example 8 were produced in the same manner as Example 1 except for using a resin film 32B having a surface shape with Ra of 0.23 μm and Sm of 1.89 μm (a PET film) as the mat member 32 in the calender treatment.

Example 9

A mesh sample and a solid sample of Example 9 were produced in the same manner as Example 1 except for using a resin film 32B having a surface shape with Ra of 0.72 μm and Sm of 5.54 μm (a PET film) as the mat member 32 in the calender treatment.

Example 10

A mesh sample and a solid sample of Example 10 were produced in the same manner as Example 1 except for using a resin film 32B having a surface shape with Ra of 0.60 μm and Sm of 4.30 μm (a PET film) as the mat member 32 in the calender treatment.

Example 11

A mesh sample and a solid sample of Example 11 were produced in the same manner as Example 1 except for using a resin film 32B having a surface shape with Ra of 0.27 μm and Sm of 5.29 μm (a PET film) as the mat member 32 in the calender treatment.

Example 12

A mesh sample and a solid sample of Example 12 were produced in the same manner as Example 1 except for using a resin film 32B having a surface shape with Ra of 0.49 μm and Sm of 4.86 μm (a PET film) as the mat member 32 in the calender treatment.

Example 13

A mesh sample and a solid sample of Example 13 were produced in the same manner as Example 1 except for using a resin film 32B having a surface shape with Ra of 0.57 μm and Sm of 7.33 μm (a PET film) as the mat member 32 in the calender treatment.

Example 14

A mesh sample and a solid sample of Example 14 were produced in the same manner as Example 1 except for using a resin film 32B having a surface shape with Ra of 0.64 μm and Sm of 3.41 μm (a PET film) as the mat member 32 in the calender treatment.

Example 15

A mesh sample and a solid sample of Example 15 were produced in the same manner as Example 1 except for using a resin film 32B having a surface shape with Ra of 1.41 μm and Sm of 4.89 μm (a PET film) as the mat member 32 in the calender treatment.

Comparative Example 1

A mesh sample and a solid sample of Comparative Example 1 were produced in the same manner as Example 1 except for not performing the calender treatment.

Comparative Example 2

A mesh sample and a solid sample of Comparative Example 2 were produced in the same manner as Example 1 except for using a resin film 32B having a surface shape with Ra of 0.03 μm and Sm of 0.86 μm (a PET film) as the mat member 32 in the calender treatment.

Comparative Example 3

A mesh sample and a solid sample of Comparative Example 3 were produced in the same manner as Example 1 except for using a metal plate 32A having a surface shape with Ra of 0.15 μm and Sm of 1.91 μm (a chromium-plated stainless plate) as the mat member 32 in the calender treatment.

Comparative Example 4

A mesh sample and a solid sample of Comparative Example 4 were produced in the same manner as Example 1 except for using a metal plate 32A having a surface shape with Ra of 0.13 μm and Sm of 1.90 μm (a chromium-plated stainless plate) as the mat member 32 in the calender treatment.

Comparative Example 5

A mesh sample and a solid sample of Comparative Example 5 were produced in the same manner as Example 1 except for using a metal plate 32A having a surface shape with Ra of 0.11 μm and Sm of 2.28 μm (a chromium-plated stainless plate) as the mat member 32 in the calender treatment.

Comparative Example 6

A mesh sample and a solid sample of Comparative Example 6 were produced in the same manner as Example 1 except for using a metal plate 32A having a surface shape with Ra of 0.15 μm and Sm of 2.19 μm (a chromium-plated stainless plate) as the mat member 32 in the calender treatment.

Comparative Example 7

A mesh sample and a solid sample of Comparative Example 7 were produced in the same manner as Example 1 except for using a metal plate 32A having a surface shape with Ra of 0.49 μm and Sm of 4.07 μm (a chromium-plated stainless plate) as the mat member 32 in the calender treatment.

Comparative Example 8

A mesh sample and a solid sample of Comparative Example 8 were produced in the same manner as Example 1 except for using a metal plate 32A having a surface shape with Ra of 0.32 μm and Sm of 3.67 μm (a chromium-plated stainless plate) as the mat member 32 in the calender treatment.

Comparative Example 9

A mesh sample and a solid sample of Comparative Example 9 were produced in the same manner as Example 1 except for using a metal plate 32A having a surface shape with Ra of 0.31 μm and Sm of 3.19 μm (a chromium-plated stainless plate) as the mat member 32 in the calender treatment.

Comparative Example 10

A mesh sample and a solid sample of Comparative Example 10 were produced in the same manner as Example 1 except for using a metal plate 32A having a surface shape with Ra of 0.59 μm and Sm of 4.76 μm (a chromium-plated stainless plate) as the mat member 32 in the calender treatment.

Comparative Example 11

A mesh sample and a solid sample of Comparative Example 11 were produced in the same manner as Example 1 except for using a metal plate 32A having a surface shape with Ra of 0.41 μm and Sm of 3.09 μm (a chromium-plated stainless plate) as the mat member 32 in the calender treatment.

Comparative Example 12

A mesh sample and a solid sample of Comparative Example 12 were produced in the same manner as Example 1 except for using a metal plate 32A having a surface shape with Ra of 0.79 μm and Sm of 41.13 μm (a stainless plate) as the mat member 32 in the calender treatment.

Comparative Example 13

A mesh sample and a solid sample of Comparative Example 13 were produced in the same manner as Example 1 except for using a metal plate 32A having a surface shape with Ra of 0.38 μm and Sm of 13.42 μm (a stainless plate) as the mat member 32 in the calender treatment.

Comparative Example 14

A mesh sample and a solid sample of Comparative Example 14 were produced in the same manner as Example 1 except for using a metal plate 32A having a surface shape with Ra of 0.28 μm and Sm of 8.04 μm (a stainless plate) as the mat member 32 in the calender treatment.

(Evaluation Results)

The properties and evaluation results of Examples 1 to 15 and Comparative Examples 1 to 14 are shown in Table 3. It should be noted that [um] represents the unit [μm] in Table 3.

TABLE 3

| | | Calender surface | | | Transparent conductive film | | | | | | | | |
|---|---|---|---|---|---|---|---|---|---|---|---|---|---|
| | | Surface shape | | | Solid sample | | | | | | | Mesh sample | | |
| | Material | Ra [um] | Sm [um] | $Ra^2$/Sm [um] | Ra [um] | Sm [um] | $Ra^2$/Sm [um] | Volume content [%] | Specular reflectance [%] | Specular reflectance of back surface [%] | Total light transmittance [%] | Wiring resistance ratio | Adhesion | Pattern visibility |
| Example 1 | SUS | 0.28 | 1.87 | 0.038 | 0.19 | 3.05 | 0.012 | 52 | 0.6 | 0.8 | 22.2 | A | A | A |
| Example 2 | SUS/Cr platin | 0.23 | 2.16 | 0.023 | 0.20 | 2.63 | 0.015 | 52 | 0.6 | 0.8 | 21.2 | A | A | A |
| Example 3 | SUS/Cr platin | 0.20 | 2.21 | 0.019 | 0.16 | 2.29 | 0.012 | 52 | 1.2 | 0.8 | 22.6 | A | A | B |
| Example 4 | SUS/Cr platin | 1.29 | 11.54 | 0.145 | 0.28 | 5.72 | 0.014 | 42 | 2.3 | 0.8 | 23.4 | B | A | C |
| Example 5 | SUS/Cr platin | 1.08 | 12.32 | 0.095 | 0.32 | 6.25 | 0.016 | 44 | 1.8 | 0.8 | 24.0 | B | A | C |
| Example 6 | SUS/Cr platin | 1.82 | 13.91 | 0.238 | 0.38 | 4.88 | 0.029 | 42 | 2.8 | 0.8 | 22.6 | B | A | C |
| Example 7 | SUS/Cr platin | 1.27 | 15.58 | 0.103 | 0.31 | 5.27 | 0.018 | 48 | 1.9 | 0.8 | 22.3 | B | A | C |
| Example 8 | PET | 0.23 | 1.89 | 0.027 | 0.17 | 2.05 | 0.014 | 52 | 0.4 | 0.8 | 18.9 | A | A | A |
| Example 9 | PET | 0.72 | 5.54 | 0.094 | 0.26 | 3.58 | 0.018 | 53 | 0.6 | 0.8 | 17.9 | A | A | A |
| Example 10 | PET | 0.60 | 4.30 | 0.083 | 0.26 | 3.45 | 0.020 | 55 | 0.8 | 0.8 | 21.4 | A | A | A |
| Example 11 | PET | 0.27 | 5.29 | 0.014 | 0.19 | 3.37 | 0.011 | 55 | 2.8 | 0.8 | 19.6 | A | A | B |
| Example 12 | PET | 0.49 | 4.86 | 0.049 | 0.25 | 2.86 | 0.022 | 53 | 0.7 | 0.8 | 18.7 | A | A | A |
| Example 13 | PET | 0.57 | 7.33 | 0.045 | 0.30 | 3.17 | 0.028 | 52 | 0.7 | 0.8 | 18.9 | A | A | A |
| Example 14 | PET | 0.64 | 3.41 | 0.118 | 0.25 | 3.38 | 0.018 | 52 | 0.6 | 0.8 | 17.6 | A | A | A |
| Example 15 | PET | 1.41 | 4.89 | 0.404 | 0.22 | 2.92 | 0.016 | 50 | 0.5 | 0.8 | 16.6 | B | A | A |
| Com. Ex. 1 | N/A | — | — | — | 0.21 | 2.33 | 0.020 | 30 | 0.5 | 0.6 | 13.1 | B | D | A |
| Com. Ex. 2 | PET | 0.03 | 0.86 | 0.001 | 0.09 | 2.74 | 0.003 | 63 | 11.3 | 0.8 | 21.0 | A | A | D |
| Com. Ex. 3 | SUS/Cr platin | 0.15 | 1.91 | 0.011 | 0.13 | 2.40 | 0.007 | 53 | 3.8 | 0.8 | 21.6 | A | A | D |

TABLE 3-continued

| | | Calender surface | | | | | | Transparent conductive film | | | | | |
| | | Surface shape | | | Solid sample | | | | | | Mesh sample | | |
| | | | | | | | | | Specular reflectance | | | | | |
| | Material | Ra [um] | Sm [um] | Ra²/Sm [um] | Ra [um] | Sm [um] | Ra²/Sm [um] | Volume content [%] | Specular reflectance [%] | of back surface [%] | Total light transmittance [%] | Wiring resistance ratio | Adhesion | Pattern visibility |
|---|---|---|---|---|---|---|---|---|---|---|---|---|---|---|
| Com. Ex. 4 | SUS/Cr platin | 0.13 | 1.90 | 0.008 | 0.13 | 2.07 | 0.008 | 53 | 4.6 | 0.8 | 22.5 | A | A | D |
| Com. Ex. 5 | SUS/Cr platin | 0.11 | 2.28 | 0.005 | 0.10 | 2.36 | 0.004 | 52 | 9.3 | 0.8 | 23.0 | A | A | D |
| Com. Ex. 6 | SUS/Cr platin | 0.15 | 2.19 | 0.010 | 0.11 | 2.13 | 0.006 | 52 | 3.5 | 0.8 | 22.5 | A | A | D |
| Com. Ex. 7 | SUS/Cr platin | 0.49 | 4.07 | 0.060 | 0.32 | 3.89 | 0.026 | 48 | 0.6 | 0.8 | 21.0 | D | A | A |
| Com. Ex. 8 | SUS/Cr platin | 0.32 | 3.67 | 0.028 | 0.25 | 2.84 | 0.023 | 48 | 0.7 | 0.8 | 21.1 | D | A | A |
| Com. Ex. 9 | SUS/Cr platin | 0.31 | 3.19 | 0.030 | 0.18 | 2.52 | 0.013 | 47 | 0.6 | 0.8 | 20.6 | D | A | A |
| Com. Ex. 10 | SUS/Cr platin | 0.59 | 4.76 | 0.073 | 0.22 | 3.09 | 0.016 | 48 | 0.6 | 0.8 | 21.2 | D | A | A |
| Com. Ex. 11 | SUS/Cr platin | 0.41 | 3.09 | 0.054 | 0.26 | 2.92 | 0.023 | 50 | 0.6 | 0.8 | 20.9 | D | A | A |
| Com. Ex. 12 | SUS | 0.79 | 41.13 | 0.015 | 0.19 | 4.54 | 0.008 | 53 | 5.0 | 0.8 | 22.7 | A | A | D |
| Com. Ex. 13 | SUS | 0.38 | 13.42 | 0.010 | 0.21 | 5.59 | 0.008 | 53 | 5.2 | 0.8 | 22.7 | A | A | D |
| Com. Ex. 14 | SUS | 0.28 | 8.04 | 0.010 | 0.17 | 5.63 | 0.005 | 53 | 7.4 | 0.8 | 22.4 | A | A | D |

As shown in Table 3, in all of Examples 1 to 15, the mesh samples had good wiring resistance ratios, adhesions, and visual pattern detection difficulties. In particular, in Examples 1, 2, 8 to 10, and 12 to 14, the mesh samples had excellent wiring resistance ratios, adhesions, and visual pattern detection difficulties, evaluated as "A". In Examples 8 to 15, the resin films 32B (the PET films) were used as the mat member 32, whereby the mesh samples had excellent properties totally. For example, in Example 3, the metal plate 32A was used as the mat member 32, whereby the solid sample had a specular reflectance of 1.2%, and the mesh sample had a visual detection difficulty evaluation result of "B". Similarly, in Example 4, the metal plate 32A was used as the mat member 32, whereby the solid sample had a specular reflectance of 2.3%, and the mesh sample had a visual detection difficulty evaluation result of "C". In contrast, for example, in Example 11, where the resin film 32B was used as the mat member 32, though the solid sample had a specular reflectance of 2.8%, the mesh sample had a visual detection difficulty evaluation result of "B". In Examples 4 to 7, the Sm values of the surface shapes in the mat members 32 were larger than the width line width (4 μm) of the thin metal wire, and thus the Sm values of the surface shapes in the solid samples were more than 4 μm, whereby the visual pattern detection difficulties were evaluated as "C", but practical problems were not caused. Furthermore, in Examples 4 to 7, the Ra values of the surface shapes in the mat members 32 were larger than ⅙ (approximately 0.42 μm) of the thickness tc (2.5 μm) of the thin metal wire 24 measured before the calender treatment, the wiring resistance ratios were evaluated as "B", but the electrical resistances were advantageously lower than that of Comparative Example 1.

Figure 11:
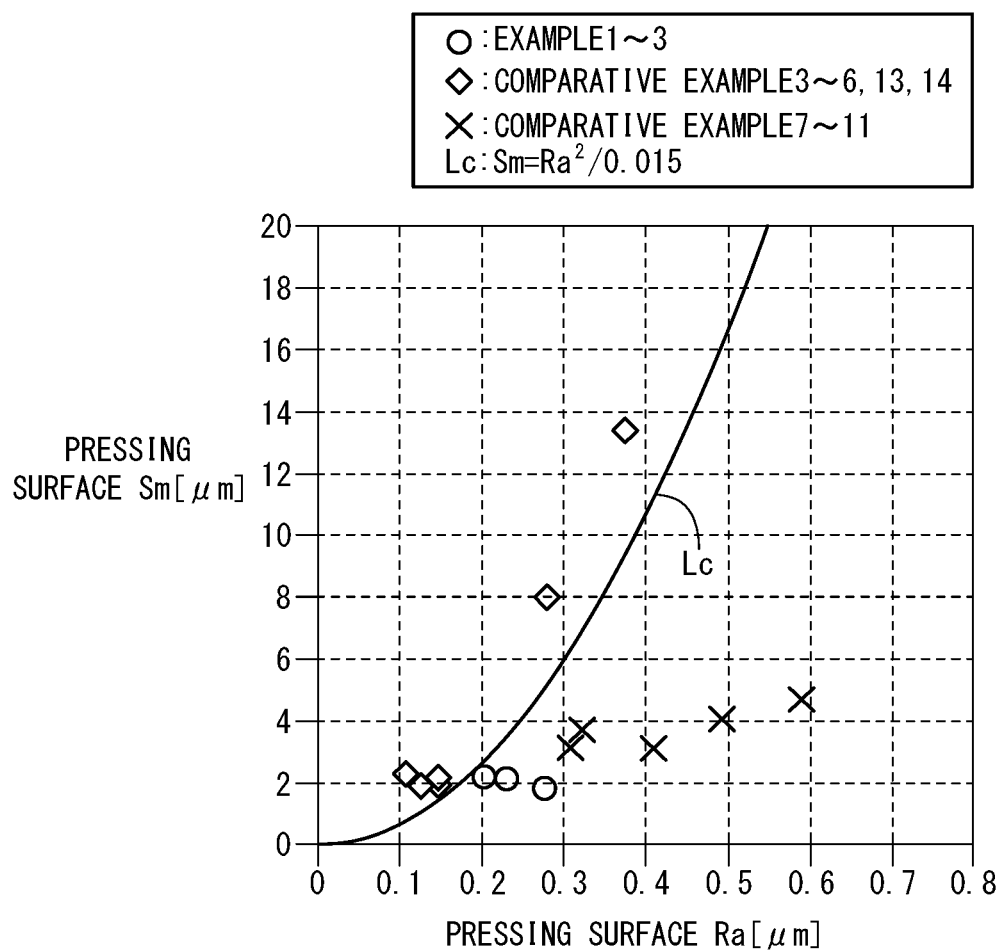
FIG. 11 is a graph plotting the results of Examples 1 to 3, Comparative Examples 3 to 6, 13, and 14, and Comparative Examples 7 to 11, where the abscissa represents the Ra value of a pressing surface of a metal plate and the ordinate represents the Sm value of the pressing surface.

Furthermore, the wiring resistance ratios of Examples 1 to 3 were evaluated as "A", and those of Comparative Examples 7 to 11 were evaluated as "D". The visual pattern detection difficulties of Examples 1 and 2 were evaluated as "A", that of Example 3 was evaluated as "B", and those of Comparative Examples 3 to 6 and 12 to 14 were evaluated as "D". FIG. 11 is a graph plotting the evaluation results of representative Examples 1 to 3 and Comparative Examples 3 to 6, 7 to 11, 13, and 14, where the abscissa represents the Ra value of the pressing surface of the metal plate, and the ordinate represents the Sm value of the pressing surface. Examples 1 to 3 had the most excellent evaluation results, and Comparative Examples 3 to 6, 7 to 11, 13, and 14 had poor results in the wiring resistance ratio or visual pattern detection difficulty evaluation. Comparative Example 12 had a high Sm value of 41.13, and therefore the results were not plotted. The curve Lc represents $Sm = Ra^2/0.015$.

As is clear from the results, in the transparent conductive film 10, it is preferred that a part of the metal wiring portion 14 having the mesh pattern electrode 42 has a surface shape satisfying the condition of $Ra^2/Sm > 0.01$ μm and a metal volume content of 35% or more. Furthermore, it is more preferred that the part having the mesh pattern electrode 42 has an Sm value of 4 μm or less.

In addition, in the case of using the metal plate 32A as the mat member 32 for the calender treatment, it is preferred that the metal plate has an $Ra^2/Sm$ value of more than 0.015 μm. It is particularly preferred that the metal plate has an Sm value equal to or smaller than the line width Wb of the thin metal wire 24, an Ra value equal to or smaller than ⅙ of the thickness tc of the thin metal wire 24 measured before the calender treatment, and an $Ra^2/Sm$ value of more than 0.015 μm.

On the other hand, in the case of using the resin film 32B as the mat member 32 for the calender treatment, it is preferred that the resin film has a surface shape with an Ra value of more than 0.15 µm. Furthermore, it is preferred that the resin film has an $Ra^2/Sm$ value of more than 0.01 µm.

In the above Examples, the evaluation results were obtained in the case of using the mat member 32 in the calender treatment. Similar evaluation results could be obtained also in the case of using a calender apparatus containing a combination of a metal roller having a roughened surface and a resin roller having a mirror-finished surface, without the mat member 32. In this case, in the calender treatment, a jack pressure of 11.4 MPa was applied while the mesh or solid sample was conveyed at a speed of 120 mm/minute. In this treatment, the metal portion of the mesh or solid sample was brought into contact with the metal roller. In the evaluation of the surface properties of the metal roller, an end of the metal roller was cut to prepare a small sample that could be placed on a stage of the microscope.

Supposing that the metal roller is cut, the resultant metal roller cannot be used for the production. Thus, it is substantially impossible to evaluate the uncut metal roller for the production by cutting out the metal roller. The surface shape (surface roughness) of the metal roller, however, can be measured by transferring the surface shape to a film and by evaluating the surface shape of the film in the following manner.

First, a 40-µm-thick film of triacetylcellulose (hereinafter referred to as TAC) is immersed in acetone for 5 seconds. After the immersion in acetone, the TAC is gently overlaid on the metal roller while preventing bubble introduction, and is then air-dried. After the drying, the TAC is slowly peeled off. Then, the surface shape of the metal roller is transferred to the TAC. The surface roughness of the transferred surface of the TAC is measured using the laser microscope in the same manner as the surface shape evaluation method of Example 1, whereby the surface roughness of the metal roller is determined. The surface roughness Ra and Sm of the transferred surface of the TAC correspond perfectly to those of the original surface of the metal roller, and it is not necessary to correct the measured values.

Second Example

In Examples 16 and 17 and Comparative Example 15, various properties were evaluated under various surface shapes of supports. The properties and evaluation results of Examples 16 and 17 and Comparative Example 15 are shown in Table 4. It should be noted that [um] represents the unit [µm] also in Table 4.

Example 16

(1. Formation of Plating Base Polymer Layer Containing Reduced Metal Particles)
[Preparation of Composition for Forming Plating Base Polymer Layer]

7.1% by mass of an acrylic polymer was dissolved in a mixture solvent of 73% by mass of 1-methoxy-2-propanol and 19.9% by mass of water to prepare a solution. 0.35% by mass of a photopolymerization initiator (ESACURE KTO-46 available from Lamberti) was further added to the solution, and the resultant was stirred to prepare a plating base polymer solution.

The plating base polymer solution was applied to a PET film having a surface shape with Ra of 0.23 µm and Sm of 1.89 µm (available from FUJIFILM Corporation) by a bar coating method, the thickness of the applied solution being about 0.55 µm. The applied solution was dried at the room temperature for 10 minutes and further dried at 80° C. for 5 minutes, and was exposed to a UV light under conditions of at 254-nm wavelength and 1000 mJ/cm² by a UV irradiation device (a metal halide lamp available from GS Yuasa International Ltd.) A mesh pattern mask was used in the UV exposure for forming a mesh pattern electrode.

The resultant substrate of the PET film coated with the plating base polymer was immersed in an aqueous solution containing 1% by mass of sodium hydrogen carbonate for 5 minutes, and was washed with a pure water flow for 1 minute to remove the unreacted polymer.

(2. Deposition of Metal Precursor)

An aqueous solution containing 1% by mass of silver nitrate was prepared as a solution containing a plating metal precursor. The substrate of the PET film applied with the plating base polymer, prepared in the above step, was immersed in the metal precursor solution for 5 minutes, and then washed with a pure water flow for 1 minute, whereby the metal precursor was deposited.

(3. Reduction of Metal Precursor)

An aqueous solution containing a mixture of 0.25% by mass of formaldehyde and 0.14% by mass of sodium hydroxide was prepared as a reducing solution. The substrate of the PET film having the metal precursor, prepared in the above step, was immersed in the reducing solution for 1 minute, and was washed with a pure water flow for 1 minute, whereby the metal precursor was reduced.

(4. Electroplating)

In a pretreatment for electroplating, the substrate of the PET film having the reduced metal on the surface, prepared in the above step, was immersed in an aqueous solution containing 10% by mass of Dain Cleaner AC100 (available from Daiwa Fine Chemicals Co., Ltd.) for 30 seconds, and was washed with a pure water flow for 1 minute. In another pretreatment for the electroplating, the substrate was immersed in an aqueous solution containing 10% by mass of Dain Silver ACC (available from Daiwa Fine Chemicals Co., Ltd.) for 10 seconds, and was washed with a pure water flow for 1 minute.

Dain Silver Bright PL50 (available from Daiwa Fine Chemicals Co., Ltd.) was used as an electroplating liquid, and the pH was controlled at 9.0 by an 8-M potassium hydroxide. The PET film substrate having the pretreated reduced metal on the surface was immersed in the electroplating liquid, a plating treatment was carried out at 0.5 A/dm² for 20 seconds, and the resultant was washed with a pure water flow for 1 minute.

In an aftertreatment of the electroplating, the plated PET film substrate was immersed in an aqueous solution containing 10% by mass of Dain Silver ACC (available from Daiwa Fine Chemicals Co., Ltd.) for 90 seconds, and was washed with a pure water flow for 1 minute.

A solid sample and a mesh sample, which had a silver layer with a thickness of 200 nm, were obtained in this manner. The samples were evaluated in the same manner as Example 1. As a result, the solid sample had a specular reflectance of 2.1%, the metal portion had Ra of 0.18 μm, Sm of 2.21 μm, and a metal volume content of 97%, and the mesh sample had a wiring resistance ratio of "A", an adhesion of "A", and a pattern visibility of "C".

Example 17

Silver was vapor-deposited on a PET film having a surface shape with Ra of 0.23 μm and Sm of 1.89 μm (available from Kaisei Industries, Inc.) by using a vacuum deposition apparatus JEE-400 (available from JEOL Ltd.), the thickness of the deposited silver being 200 nm.

The solid and mesh samples were evaluated in the same manner as Example 1. As a result, the solid sample had a specular reflectance of 3.4%, the metal portion had Ra of 0.17 μm, Sm of 2.42 μm, and a metal volume content of 97%, and the mesh sample had a wiring resistance ratio of "A", an adhesion of "A", and a pattern visibility of "C".

Comparative Example 15

A solid sample and a mesh sample, which had a silver layer with a thickness of 200 nm, were obtained in the same manner as Example 16 except for using a PET film having a smoothened surface with Ra of 0.03 μm and Sm of 0.83 μm (available from FUJIFILM Corporation) instead of the PET film having a surface shape with Ra of 0.23 μm and Sm of 1.89 μm.

The solid and mesh samples were evaluated in the same manner as Example 1. As a result, the solid sample had a specular reflectance of 73.3%, the metal portion had Ra of 0.04 μm, Sm of 1.10 μm, and a metal volume content of 97%, and the mesh sample had a wiring resistance ratio of "A", an adhesion of "A", and a pattern visibility of "D".

In Comparative Example 15, the metal film was formed on the smoothened surface, whereby the specular reflectance was a significantly high value of 73.3%, and the visual pattern detection difficulty was evaluated as "D", though the metal film was formed by the plating treatment.

As is clear from the results, also in the case of forming the metal wiring portion on the support having the concave-convex surface, the products could achieve the excellent properties similar to those of Examples 3, 4, etc. in First Example. Furthermore, in comparison between Examples 16 and 17 and Comparative Example 15, it was confirmed that the visibility could be more excellent in the case of forming the metal wiring portion on the support having the concave-convex surface than in the case of forming the metal film on the smoothened surface.

It is to be understood that the transparent conductive film, the transparent conductive film production method, the touch panel, and the display device of the present invention are not limited to the above embodiments, and various changes and modifications may be made therein without departing from the scope of the present invention.

The invention claimed is:

1. A transparent conductive film comprising a support and a metal wiring portion formed thereon,
   wherein
   at least a part of the metal wiring portion has a surface shape satisfying a condition of $Ra^2/Sm>0.01$ μm and has a metal volume content of 35% or more,
   the Ra represents an arithmetic average roughness in micrometers and is equal to or smaller than a thickness of a thin metal wire located in a position where a surface roughness is measured,
   the Sm represents an average distance between convex portions and is 0.01 μm or more, and
   at least the part of the metal wiring portion has a mesh pattern containing the thin metal wire.

TABLE 4

| | | Transparent conductive film | | | | | | | | | | |
|---|---|---|---|---|---|---|---|---|---|---|---|---|
| | | Support | | | Solid sample | | | | | | Mesh sample | | |
| | | Surface shape | | | | | | Specular reflectance | | | | | |
| | Material | Ra [um] | Sm [um] | $Ra^2/Sm$ [um] | Ra [um] | Sm [um] | $Ra^2/Sm$ [um] | Volume content [%] | Specular reflectance [%] | of back surface [%] | Total light transmittance [%] | Wiring resistance ratio | Adhesion | Pattern visibility |
| Example 16 | PET film | 0.23 | 1.89 | 0.028 | 0.18 | 2.21 | 0.015 | 97 | 2.1 | 0.8 | 22.2 | A | A | C |
| Example 17 | PET film | 0.23 | 1.89 | 0.028 | 0.17 | 2.42 | 0.012 | 97 | 3.4 | 0.8 | 21.2 | A | A | C |
| Com. Exam 15 | PET film | 0.03 | 0.83 | 0.001 | 0.04 | 1.10 | 0.001 | 97 | 73.3 | 0.8 | 82.0 | A | A | D |

As shown in Table 4, in both of Examples 16 and 17, the mesh samples had excellent wiring resistance ratios and adhesions evaluated as "A". However, the specular reflectances were 2.1% and 3.4% respectively, similar to that of Example 4 in First Example. Therefore, the visual pattern detection difficulties were evaluated as "C", but practical problems were not caused. The specular reflectance was lower in Example 16 where the metal film was formed on the support by the plating treatment than in Example 17 where the metal film was formed by the vapor deposition.

2. The transparent conductive film according to claim 1, wherein
   at least the part of the metal wiring portion has Sm of 4 μm or less.

3. The transparent conductive film according to claim 1, wherein
   at least the part of the metal wiring portion has a difference of less than 3% between the specular reflectances of a front surface and a back surface.

4. The transparent conductive film according to claim 1, wherein
the transparent conductive film is obtained by a production method containing:
an exposure step of exposing a photosensitive material having the support and a silver salt emulsion layer formed thereon; and
a development step of developing the exposed silver salt emulsion layer to form a conductive pattern containing a metallic silver portion on the support.

* * * * *